US011892662B2

(12) United States Patent
Yoon et al.

(10) Patent No.: US 11,892,662 B2
(45) Date of Patent: Feb. 6, 2024

(54) DIFFRACTION LIGHT GUIDE PLATE AND METHOD OF MANUFACTURING DIFFRACTION LIGHT GUIDE PLATE

(71) Applicant: LG CHEM, LTD., Seoul (KR)

(72) Inventors: Jung Hwan Yoon, Daejeon (KR); Bu Gon Shin, Daejeon (KR); Jeong Ho Park, Daejeon (KR); Eun Kyu Her, Daejeon (KR); So Young Choo, Daejeon (KR)

(73) Assignee: LG CHEM LTD., Seoul (KR)

( * ) Notice: Subject to any disclaimer, the term of this patent is extended or adjusted under 35 U.S.C. 154(b) by 359 days.

(21) Appl. No.: 16/644,144

(22) PCT Filed: Oct. 23, 2018

(86) PCT No.: PCT/KR2018/012545
§ 371 (c)(1),
(2) Date: Mar. 3, 2020

(87) PCT Pub. No.: WO2019/083247
PCT Pub. Date: May 2, 2019

(65) Prior Publication Data
US 2020/0408969 A1    Dec. 31, 2020

(30) Foreign Application Priority Data
Oct. 24, 2017   (KR) .................. 10-2017-0138685

(51) Int. Cl.
*G02B 5/18* (2006.01)
*F21V 8/00* (2006.01)
(Continued)

(52) U.S. Cl.
CPC ............ *G02B 5/1857* (2013.01); *B23K 26/00* (2013.01); *G02B 5/18* (2013.01); *G02B 6/0016* (2013.01); *G02B 27/0172* (2013.01); *G03F 1/00* (2013.01)

(58) Field of Classification Search
CPC ...... G02B 5/1857; G02B 5/18; G02B 6/0016; G02B 27/0172; G02B 5/1842;
(Continued)

(56) References Cited

U.S. PATENT DOCUMENTS

| | | | |
|---|---|---|---|
| 7,361,878 B2* | 4/2008 | Kobayashi ........... | G02B 27/142 349/196 |
| 2002/0127497 A1* | 9/2002 | Brown .................... | G02B 1/02 359/566 |

(Continued)

FOREIGN PATENT DOCUMENTS

| | | |
|---|---|---|
| CN | 107111204 A | 8/2017 |
| JP | 63-262614 A | 10/1988 |

(Continued)

*Primary Examiner* — Balram T Parbadia
*Assistant Examiner* — Rahman Abdur
(74) *Attorney, Agent, or Firm* — Bryan Cave Leighton Paisner LLP

(57) ABSTRACT

A diffraction light guide plate, including: a first diffraction substrate; and a second diffraction substrate provided on the first diffraction substrate. The first diffraction substrate includes a first diffraction grating layer on one surface and a second diffraction grating layer on an opposite surface. The second diffraction substrate includes a third diffraction grating layer on one surface and a stress compensation layer on an opposite surface. The first diffraction grating layer separates light having a wavelength of 550 nm or more and 700 nm or less, the second diffraction grating layer separates light having a wavelength of 400 nm or more and 550 nm or less, the third diffraction grating layer separates light having a wavelength of 450 nm or more and 650 nm or less, and the (Continued)

stress compensation layer has stress in the same direction as a direction of stress of the third diffraction grating layer.

13 Claims, 19 Drawing Sheets

(51) Int. Cl.
    *G02B 27/01*      (2006.01)
    *G03F 1/00*      (2012.01)
    *B23K 26/00*      (2014.01)

(58) Field of Classification Search
    CPC .... G02B 5/1823; G02B 6/0065; B23K 26/00; G03F 1/00
    USPC ........................................................ 359/566
    See application file for complete search history.

(56) References Cited

U.S. PATENT DOCUMENTS

| | | | |
|---|---|---|---|
| 2003/0232252 A1 | 12/2003 | Mancini et al. | |
| 2016/0116739 A1* | 4/2016 | TeKolste | G02B 6/005 385/36 |
| 2016/0216203 A1* | 7/2016 | Tominaga | G01J 3/1838 |
| 2016/0370582 A1* | 12/2016 | Watanabe | G02B 5/1861 |
| 2017/0235142 A1 | 8/2017 | Wall et al. | |

FOREIGN PATENT DOCUMENTS

| | | | | |
|---|---|---|---|---|
| JP | 03-246510 A | 11/1991 | | |
| JP | 2000-047014 A | 2/2000 | | |
| JP | 2003-344630 A | 12/2003 | | |
| JP | 2005-530338 A | 10/2005 | | |
| JP | 2010-40415 A | 2/2010 | | |
| JP | 2011159967 | * | 8/2011 | ............. G02B 5/18 |
| JP | 2015-049376 A | 3/2015 | | |
| JP | 2015-099238 A | 5/2015 | | |
| JP | 2016-129154 A | 7/2016 | | |
| JP | 2017-156388 A | 9/2017 | | |
| JP | 2017-531840 A | 10/2017 | | |
| KR | 10-0779693 B1 | 11/2007 | | |
| KR | 10-2013-0000756 A | 1/2013 | | |
| KR | 20150086416 | * | 7/2015 | ....... G02F 1/133615 |
| KR | 10-2015-0120000 A | 10/2015 | | |
| WO | 2017/033975 A1 | 3/2017 | | |
| WO | 2017-120341 A1 | 7/2017 | | |

* cited by examiner

[Figure 1A]
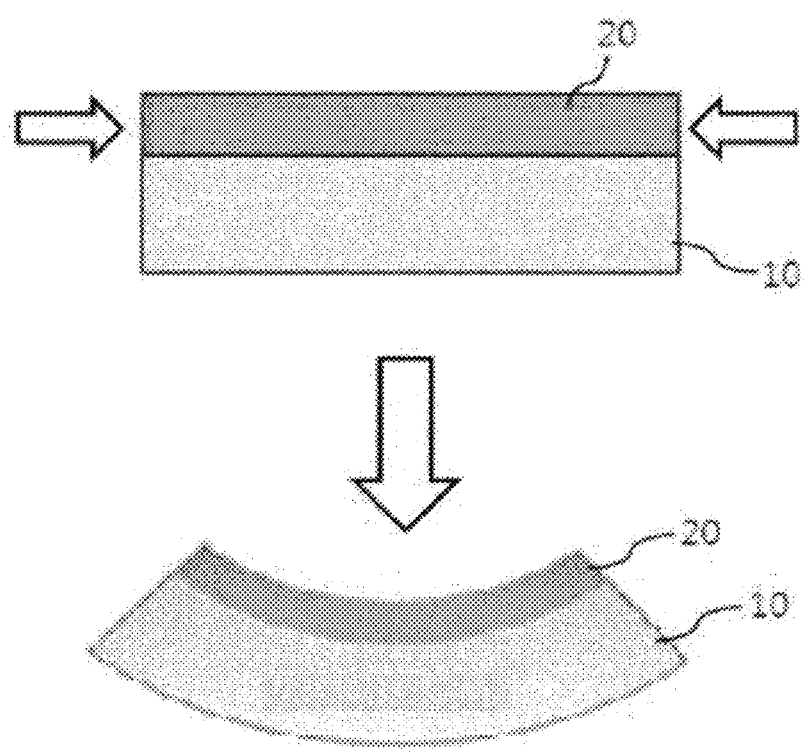

[Figure 1B]
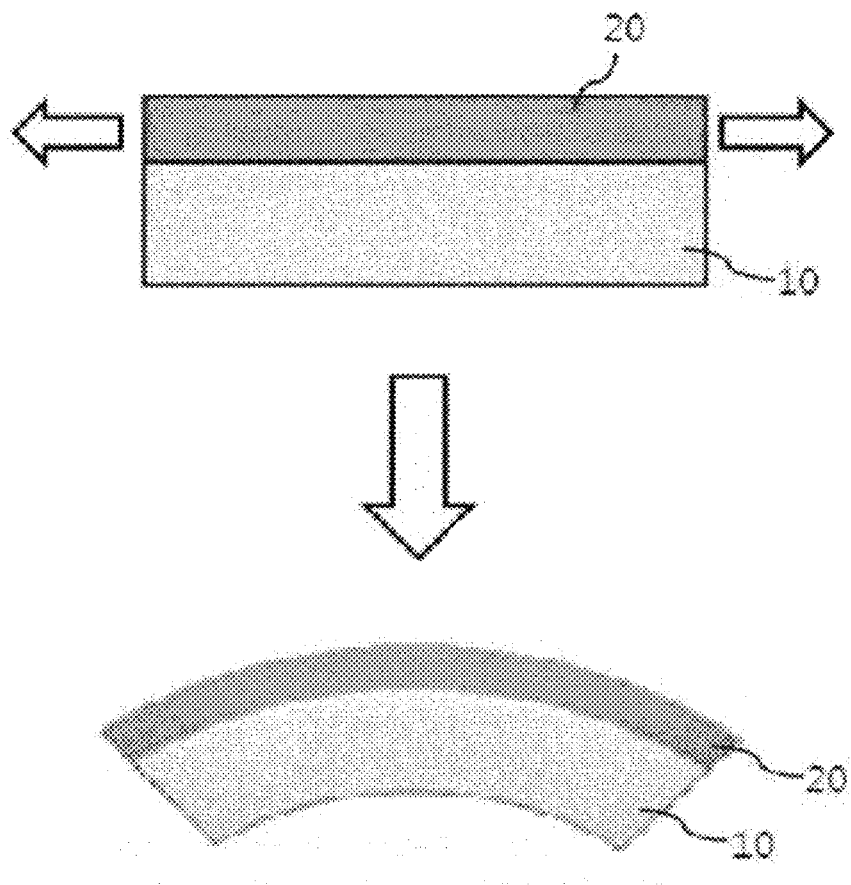

[Figure 2]
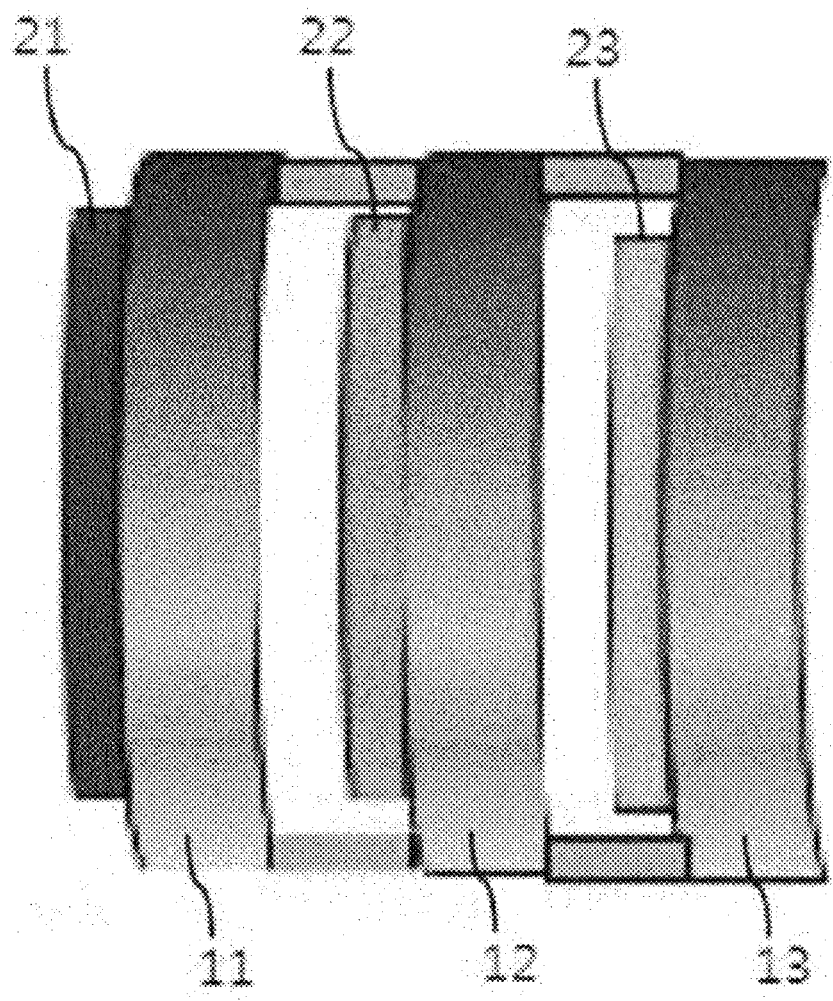
[Figure 3A]
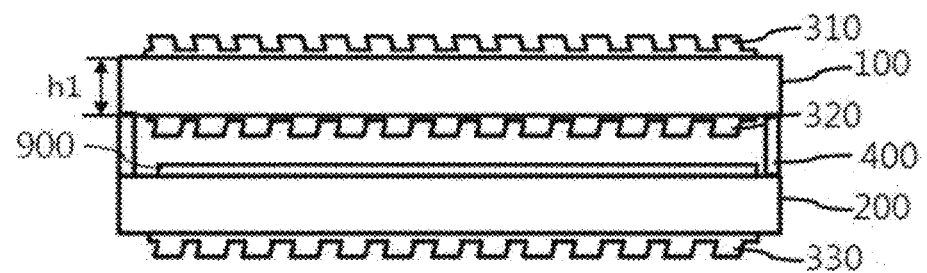

[Figure 3B]
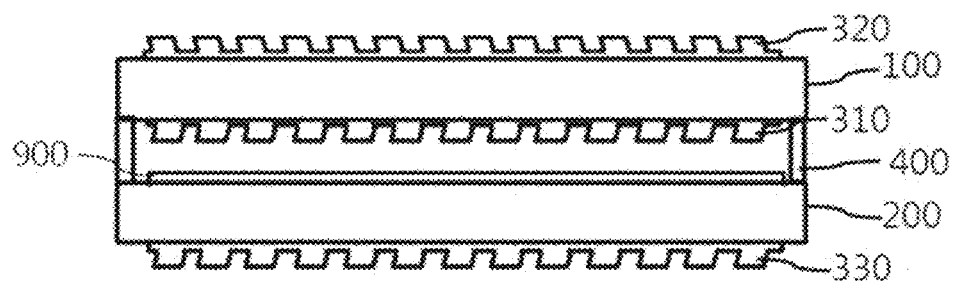
[Figure 3C]
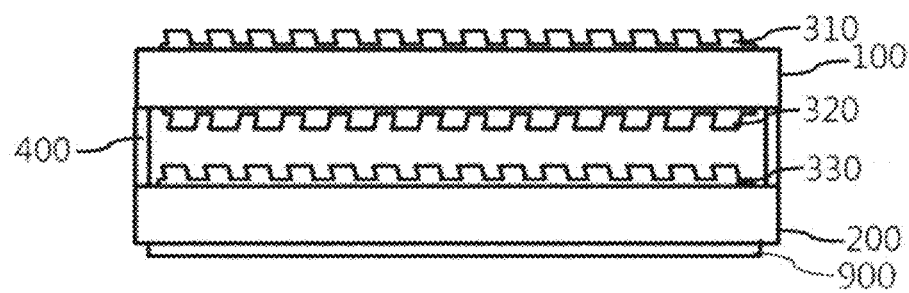
[Figure 3D]
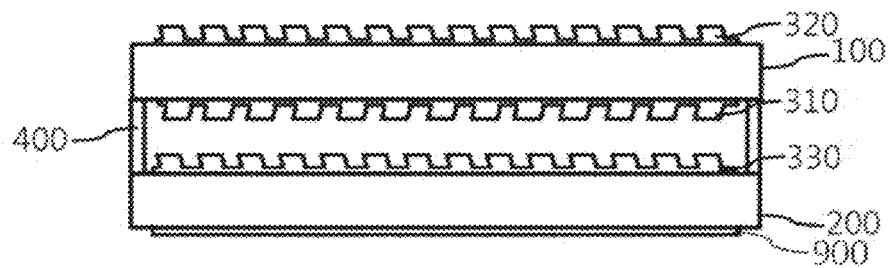

[Figure 4A]
(1)
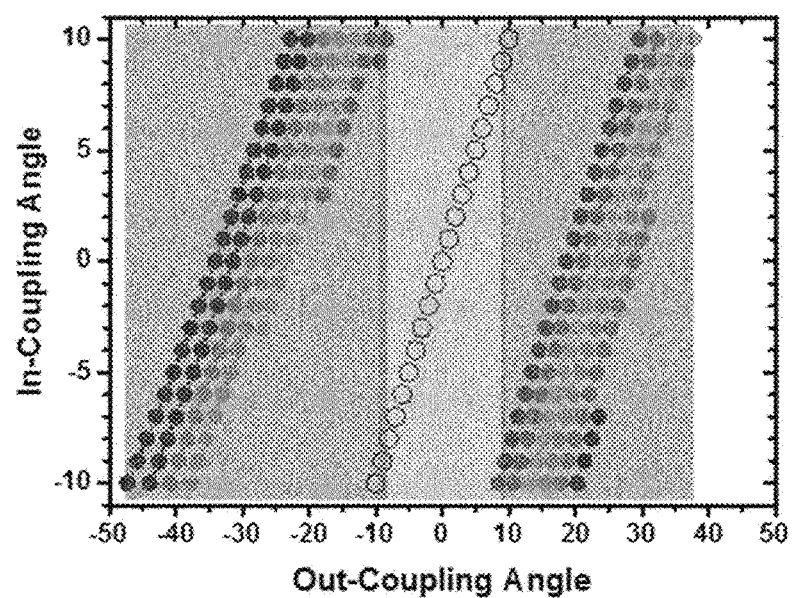
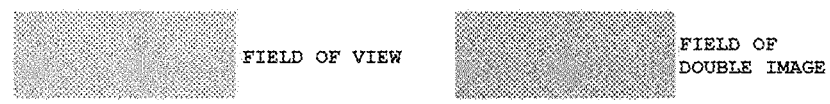
(2)
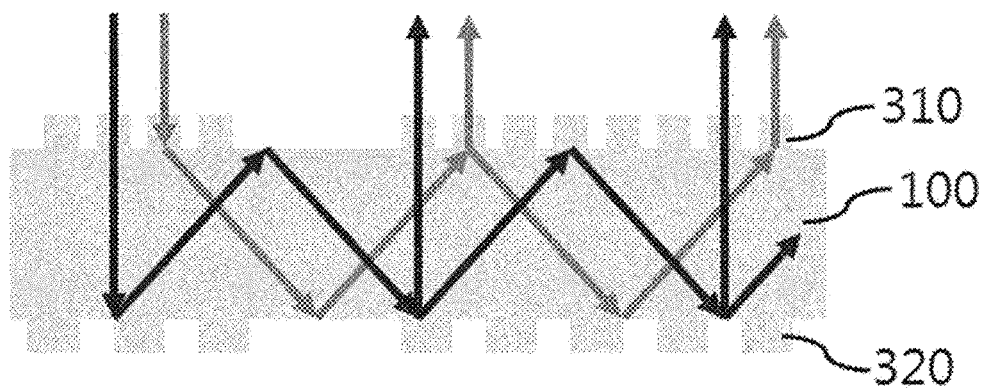

[Figure 4B]
(1)
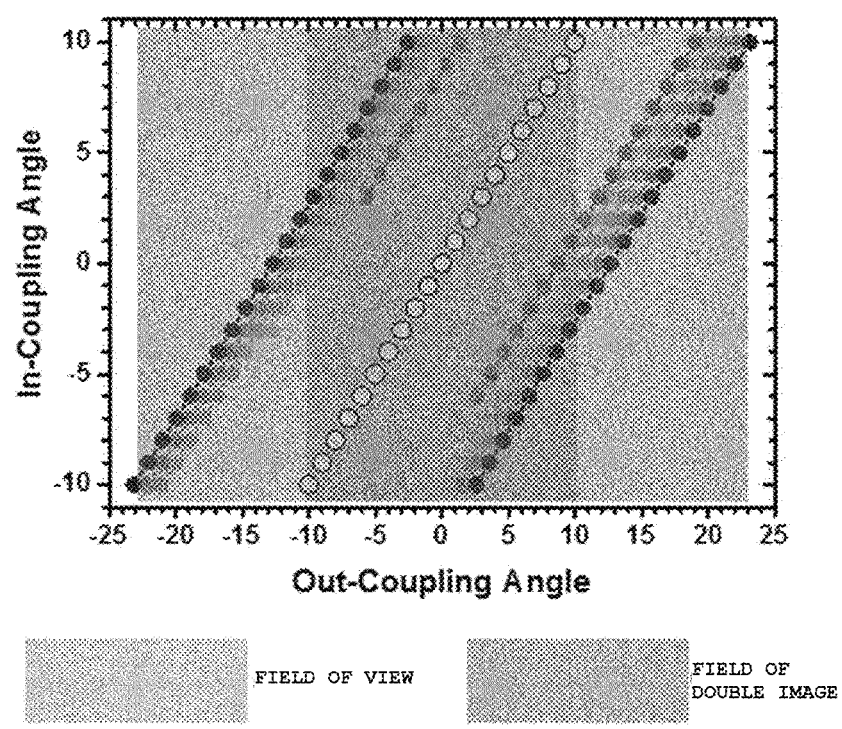
(2)
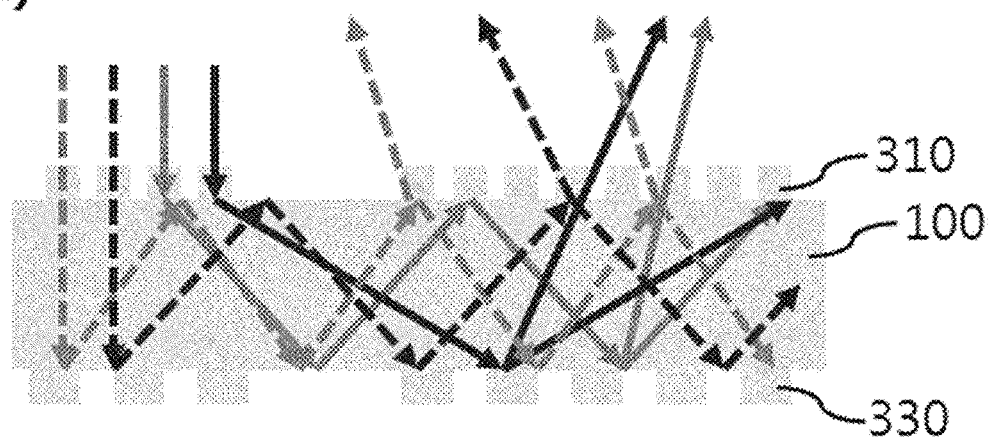

[Figure 5]
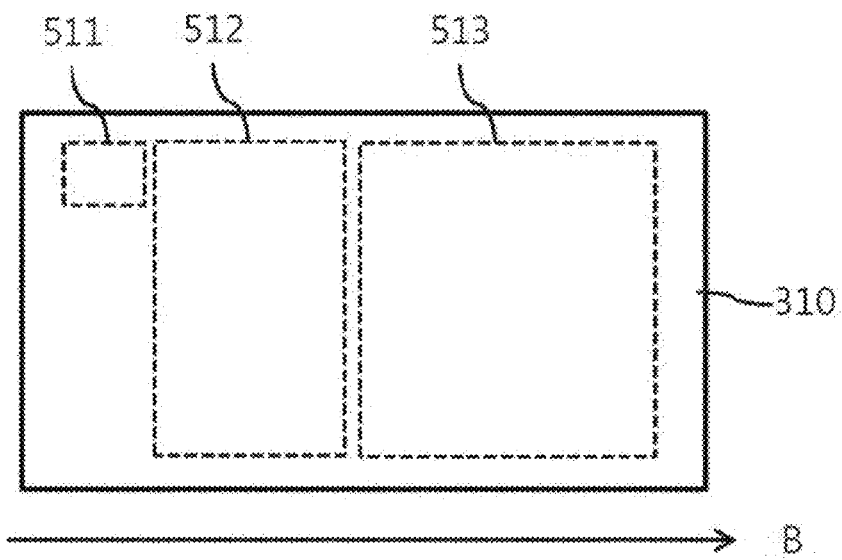
[Figure 6]
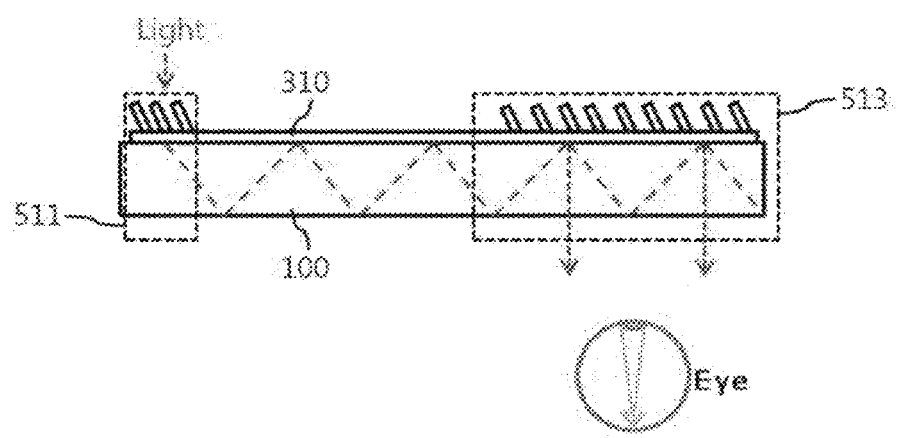

[Figure 7]
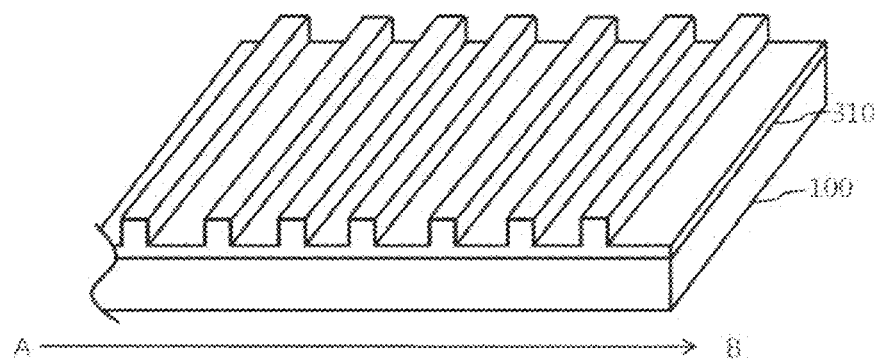
[Figure 8]
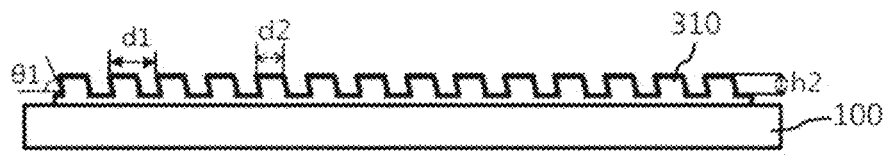

[Figure 9A]
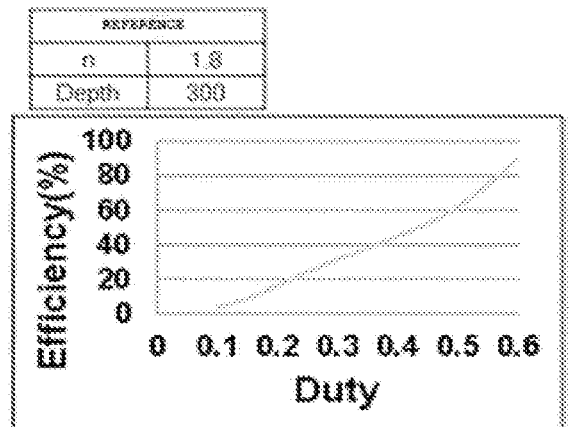
[Figure 9B]
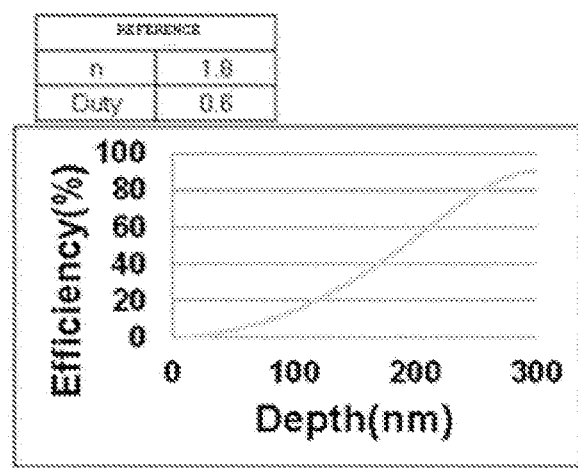
[Figure 9C]
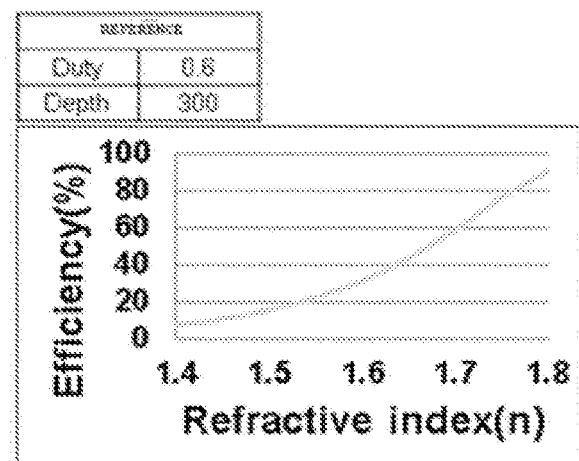

[Figure 10A]
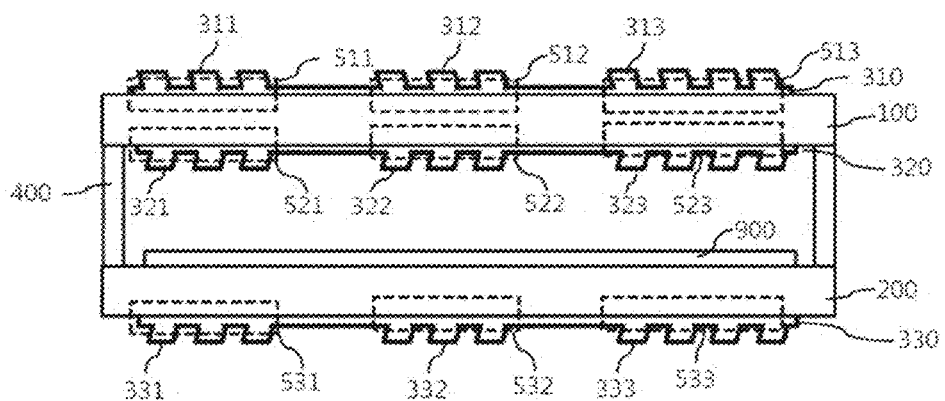
[Figure 10B]
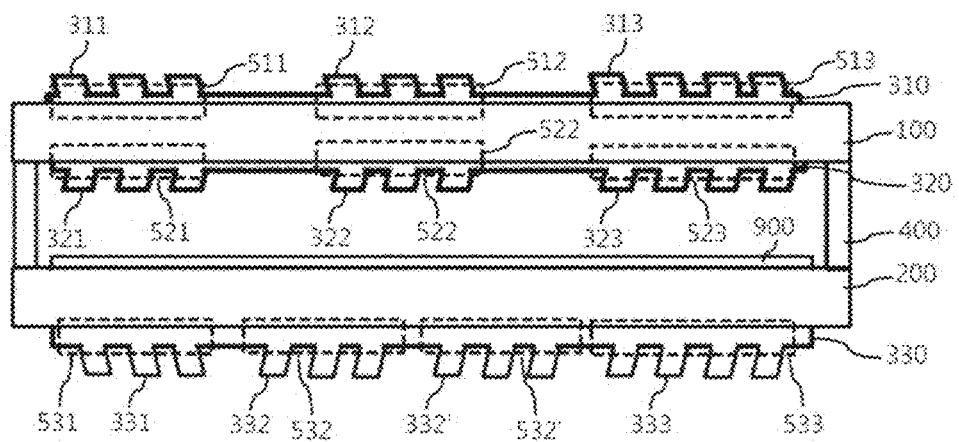

[Figure 11]
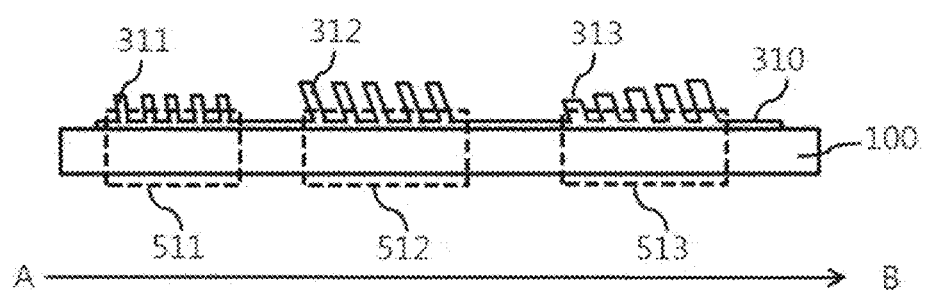

[Figure 12]
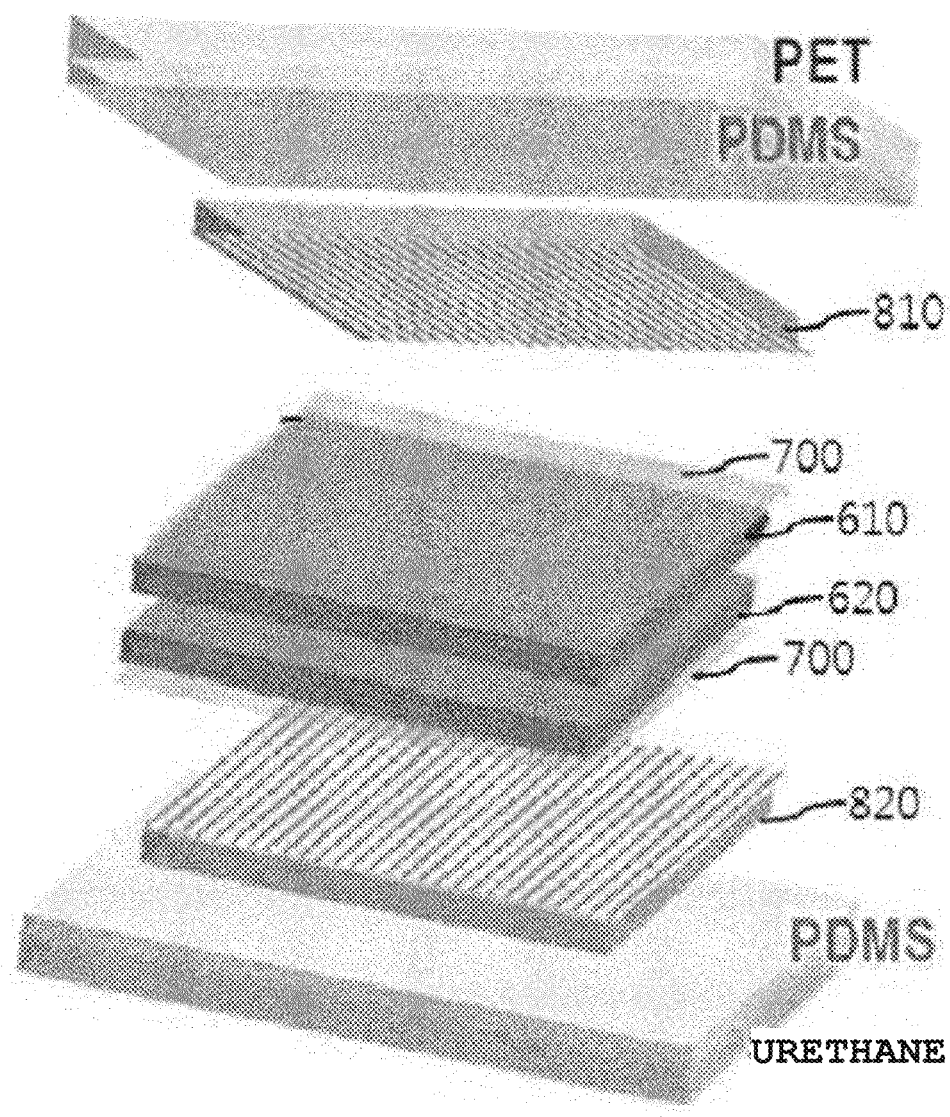

[Figure 13A]
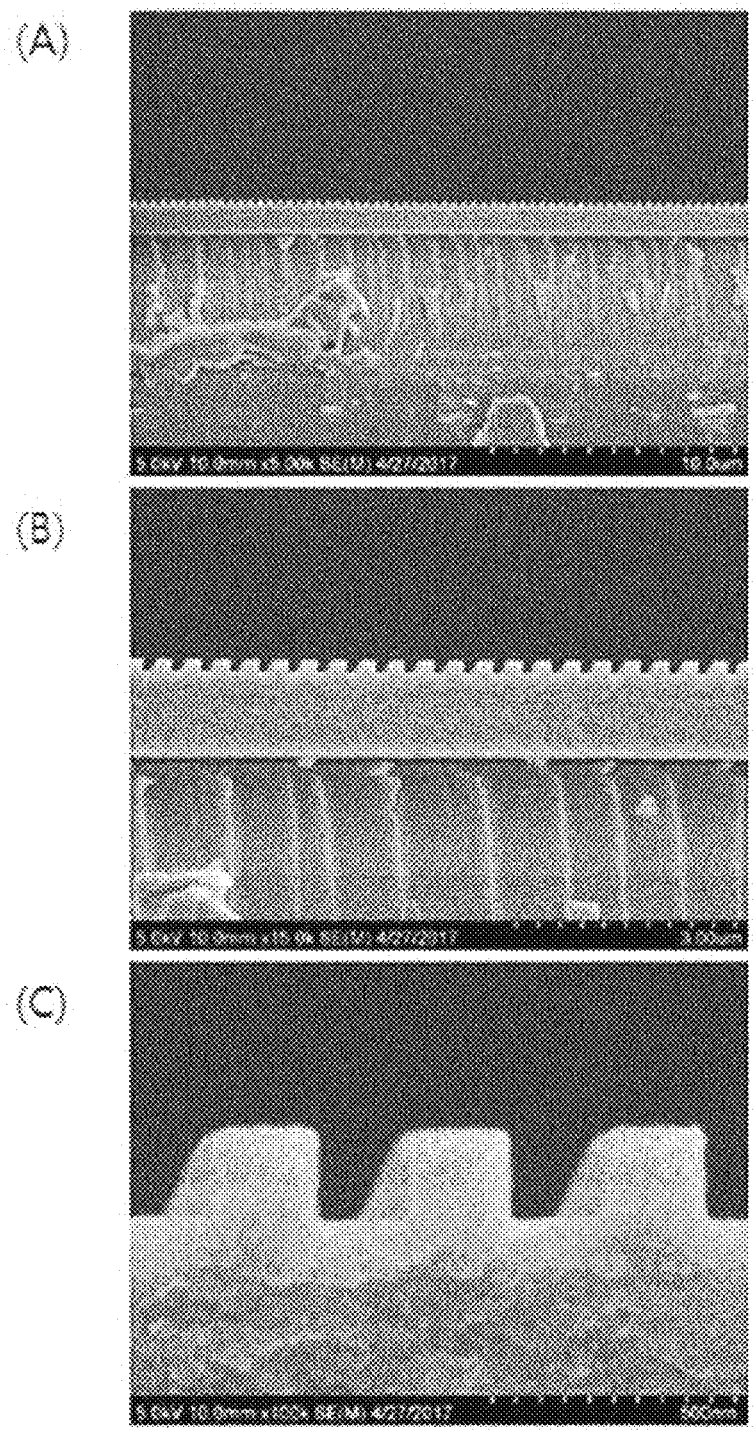

[Figure 13B]
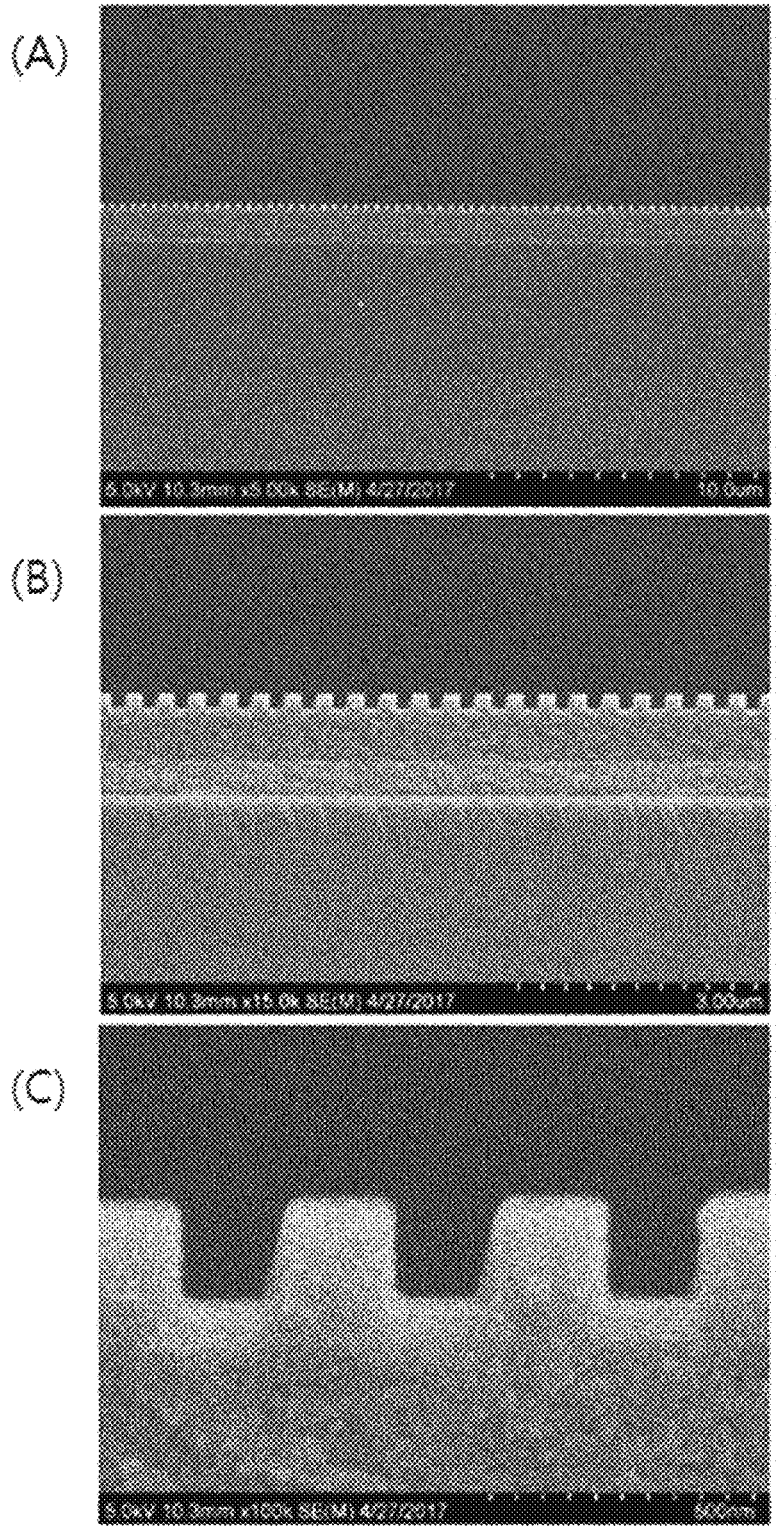

[Figure 14]
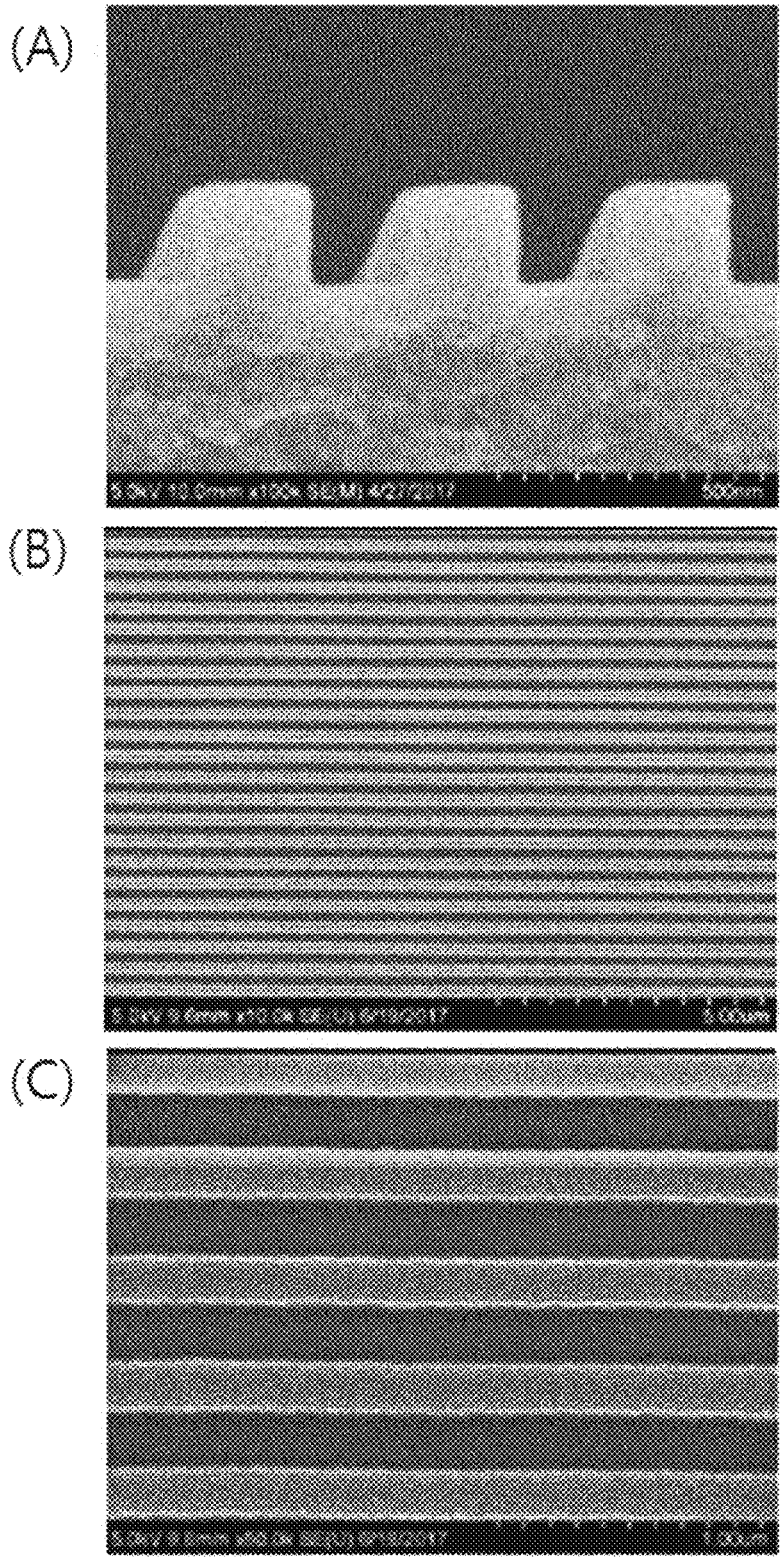

[Figure 15]
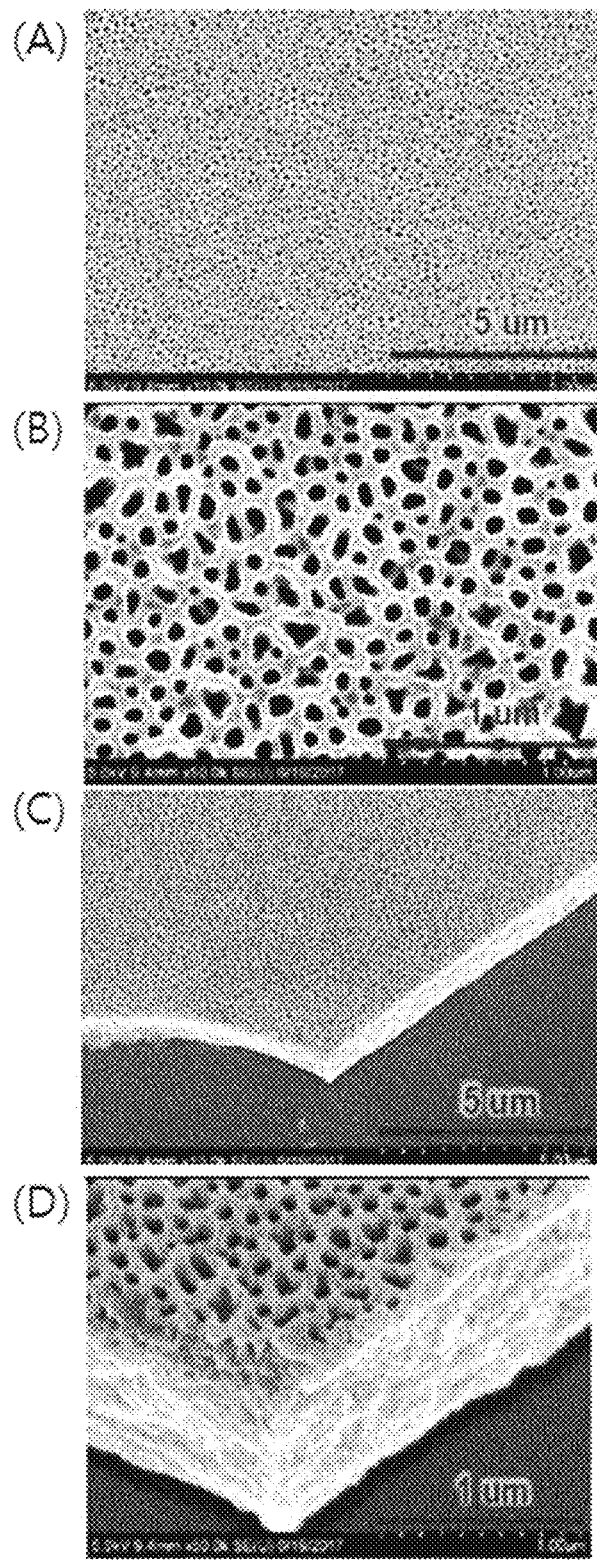

[Figure 16]
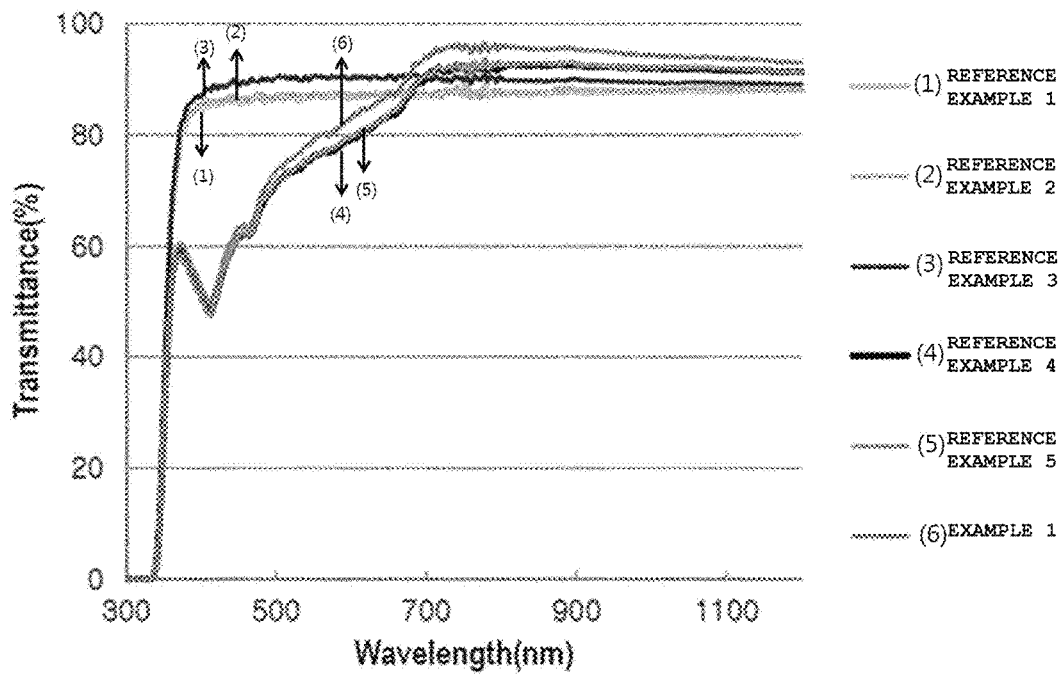
[Figure 17]
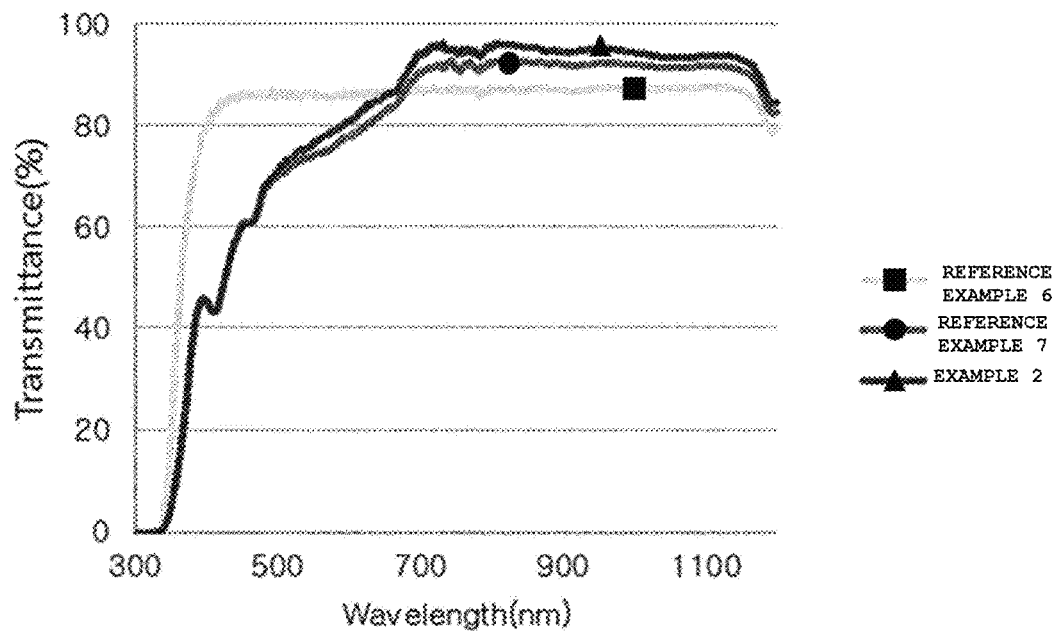

[Figure 18a]
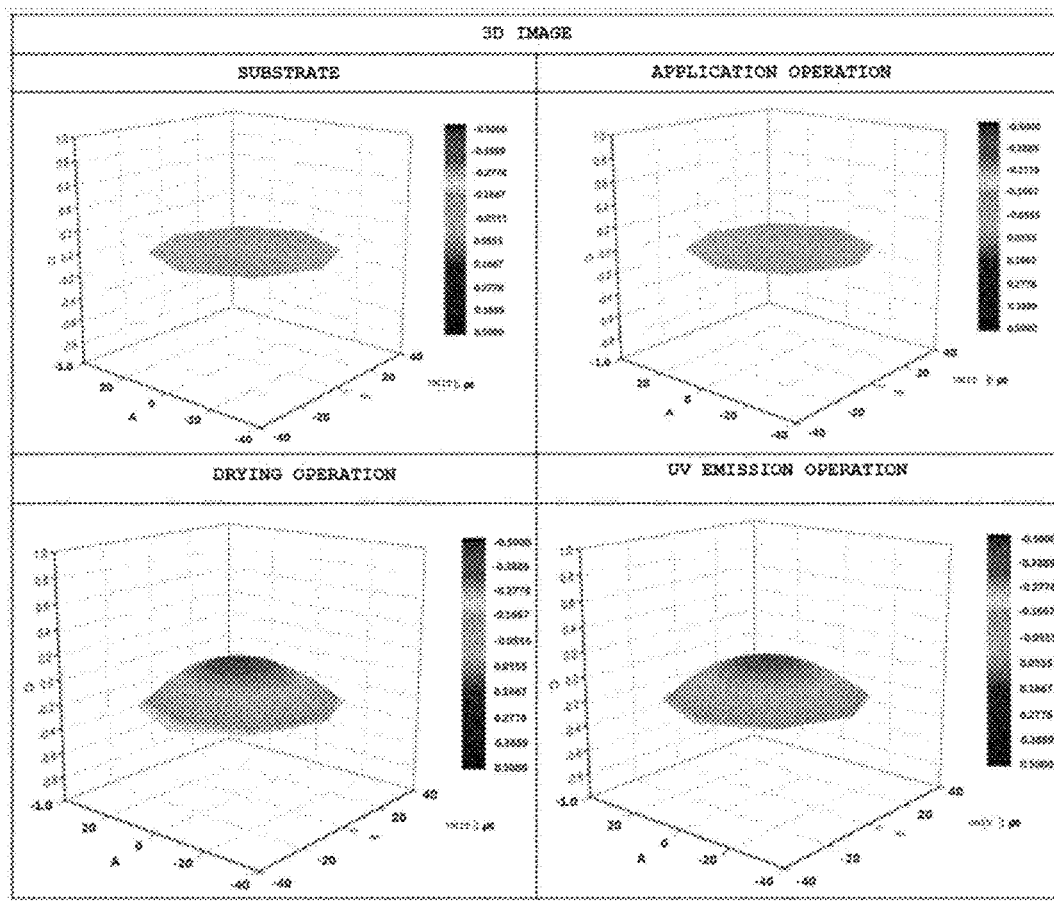

[Figure 18b]
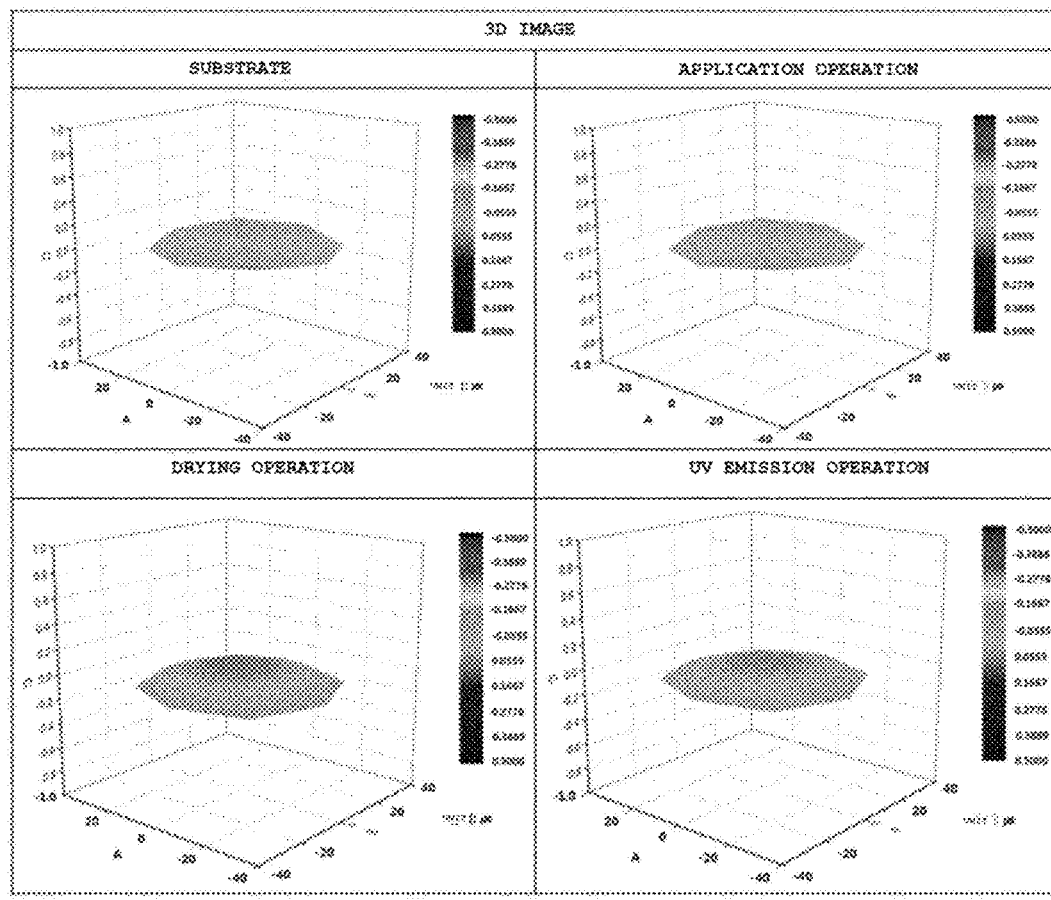

DIFFRACTION LIGHT GUIDE PLATE AND METHOD OF MANUFACTURING DIFFRACTION LIGHT GUIDE PLATE

CROSS-REFERENCE TO RELATED APPLICATIONS

This application is a U.S. national stage of international Application No. KR10-2017-0138685, filed Oct. 23, 2018, and claims priority to and the benefit of Korean Patent Application No. 10-2017-0138685 filed in the Korean Intellectual Property Office on Oct. 24, 2017, the entire contents of which are incorporated herein by reference.

TECHNICAL FIELD

The present invention relates to a diffraction light guide plate and a method of manufacturing a diffraction light guide plate.

BACKGROUND

Recently, interests in a display unit implementing Augmented Reality (AR), Mixed Reality (MR), or Virtual Reality (VR) are increased, research on a display unit implementing AR, MR, or VR has actively progressed. The display unit implementing the AR, the MR, or the VR includes a diffraction light guide plate using a diffraction phenomenon based on a wave property of light. The diffraction light guide plate basically includes three substrates, each of which is formed with a pattern layer including a nano pattern, which is capable of diffracting light and has a grating form, on one surface. However, there is a problem in that the diffraction light guide plate including the three substrates is thick, and is somewhat heavy for implementing lightness of the display unit implementing the AR, the MR, or the VR.

Further, when the pattern layer is formed on one surface of the substrate, there may occur a problem in that the substrate is transformed by stress of the pattern layer. There may occur a problem in that display performance of a display unit using a diffraction light guide plate including the substrate transformed by the stress of the pattern layer is considerably degraded and the like.

Accordingly, there is a need for a technology of effectively decreasing a thickness and weight of a diffraction light guide plate and a technology of preventing a substrate forming a diffraction light guide plate from being transformed by stress of a pattern layer.

SUMMARY

The present specification aims to provide a diffraction light guide plate and a method of manufacturing a diffraction light guide plate.

An object to be solved in the present invention is not limited to the aforementioned objects, and other objects non-mentioned herein will be clearly understood by those skilled in the art from descriptions below.

An exemplary embodiment of the present invention provides a diffraction light guide plate, including: a first diffraction substrate; and a second diffraction substrate provided on the first diffraction substrate, in which the first diffraction substrate includes a first diffraction grating layer on one surface and a second diffraction grating layer on the other surface, the second diffraction substrate includes a third diffraction grating layer on one surface and a stress compensation layer on the other surface, the first diffraction grating layer separates light having a wavelength of 550 nm or more and 700 nm or less, the second diffraction grating layer separates light having a wavelength of 400 nm or more and 550 nm or less, the third diffraction grating layer separates light having a wavelength of 450 nm or more and 650 nm or less, and the stress compensation layer has stress in the same direction as a direction of stress of the third diffraction grating layer.

Further, an exemplary embodiment of the present invention provides a method of manufacturing a diffraction light guide plate. Particularly, an exemplary embodiment of the present invention provides a method of manufacturing a diffraction light guide plate, the method including: preparing a first diffraction substrate including a first diffraction grating layer on one surface and a second diffraction grating layer on the other surface; preparing a second diffraction substrate including a third diffraction grating layer on one surface and a stress compensation layer on the other surface; and attaching the first diffraction substrate and the second diffraction substrate.

According to the exemplary embodiment of the present invention, the diffraction light guide plate includes the first diffraction substrate including the first diffraction grating layer on one surface and the second diffraction grating layer on the other surface, thereby effectively decreasing a thickness and weight of the diffraction light guide plate.

According to the exemplary embodiment of the present invention, the stress compensation layer is formed on the other surface of the second diffraction substrate, which includes the third diffraction grating layer on one surface, so that it is possible to effectively suppress the transformation of the second diffraction substrate, which may be incurred by stress of the third diffraction grating layer.

According to the exemplary embodiment of the present invention, it is possible to easily manufacture the diffraction light guide plate, of which a thickness and weight are decreased.

BRIEF DESCRIPTION OF DRAWINGS

FIGS. 1A and 1B schematically illustrate the case where a substrate is transformed by forming a pattern layer on one surface of the substrate.

FIG. 2 is schematically illustrates a diffraction light guide plate including three substrates, each of which is formed with a pattern layer on one surface.

FIGS. 3A to 3D schematically illustrate a diffraction light guide plate according to an exemplary embodiment of the present invention.

FIG. 4A illustrates an in-coupling angle and an out-coupling angle of a first diffraction substrate provided with a first diffraction grating layer and a second diffraction grating layer according to the exemplary embodiment of the present invention.

FIG. 4B illustrates an in-coupling angle and an out-coupling angle of a diffraction substrate provided with a first diffraction grating layer and a third diffraction grating layer.

FIG. 5 schematically illustrates a plane of the first diffraction grating layer according to the exemplary embodiment of the present invention.

FIG. 6 schematically illustrates a cross-section of the first diffraction substrate including the first diffraction grating layer according to the exemplary embodiment of the present invention.

FIG. 7 schematically illustrates the first diffraction grating layer including a diffraction pattern according to the exemplary embodiment of the present invention.

FIG. 8 schematically illustrates a cross-section of the diffraction pattern included in the first diffraction grating layer according to the exemplary embodiment of the present invention.

FIGS. 9A to 9C plot the simulation results of light diffraction efficiency of the diffraction grating layer according to duty, depth, and light refractive index of a pattern structure, respectively, included in the diffraction grating layer according to the exemplary embodiment of the present invention.

FIGS. 10A and 10B schematically illustrate a cross-section of a diffraction light guide plate including the first diffraction grating layer to the third diffraction grating layer according to an exemplary embodiment of the present invention.

FIG. 11 schematically illustrates the first diffraction grating layer including a first diffraction pattern to a third diffraction pattern according to an exemplary embodiment of the present invention.

FIG. 12 schematically illustrates a preparation of a first diffraction substrate by using two substrates according to an exemplary embodiment of the present invention.

FIG. 13A is a scanning electron microscope (SEM) image of a first diffraction grating layer according to Example 1 of the present invention.

FIG. 13B is an SEM image of a second diffraction grating layer according to Example 1 of the present invention.

FIG. 14 is an SEM image of a third diffraction grating layer according to Example 1 of the present invention.

FIG. 15 is an SEM image of a stress compensation layer including a reflection preventing pattern according to Example 1 of the present invention.

FIG. 16 plots the results of a measurement of light transmittance of the second diffraction substrate prepared in Example 1 of the present invention and the substrates prepared in Reference Examples 1 to 5.

FIG. 17 plots the results of a measurement of light transmittance of the second diffraction substrate prepared in Example 2 of the present invention and the substrates prepared in Reference Examples 6 and 7.

FIG. 18A is a 3D image of a substrate according to a process of manufacturing a substrate in Reference Example 8.

FIG. 18B is a 3D image of a substrate according to a process of manufacturing a substrate in Reference Example 9.

DETAILED DESCRIPTION

Throughout the specification, unless explicitly described to the contrary, when it is said that a specific part "comprises/includes" a specific constituent element, this means that another constituent element may be further "included/comprised" not that another constituent element is excluded.

In the present specification, when an element is referred to as being "on" another element, this includes the case where the element is in contact with another element, and the case where another element is present between the two elements.

Throughout the present specification, when it is said that one portion is "connected" with another portion, it includes the case where one portion is "directly connected" with another portion, and the case where one portion is connected with another portion "with another element interposed therebetween".

In the present specification, a thickness of a specific member may be an average value of the measurement values of 10 predetermined points obtained by observing a cross section of the corresponding member with an electron microscope (a scanning electron microscope (SEM), a transmission electron microscope (TEM), a scanning transmission electron microscope (STEM). When a thickness of a corresponding member is very small, the thickness of the corresponding member may be measured by magnifying a photographed picture of the corresponding member at high magnifications, and may be measured based on a center portion obtained by bisectioning an interlayer interface line in a width direction when the corresponding member is magnified as a boundary line.

The present inventors found that it is possible to effectively decrease an entire thickness and weight of a manufactured diffraction light guide plate by forming a first diffraction grating layer on one surface of a first diffraction substrate and forming a second diffraction grating layer on the other surface of the first diffraction substrate. Further, the inventors found that a first diffraction substrate including a first diffraction grating layer, which is capable of separating first light having a wavelength value of 550 nm or more and 700 nm or less, on one surface and a second diffraction grating layer, which is capable of separating second light having a wavelength value of 400 nm or more and 550 nm or less, on the other surface may effectively protect cross talk generable between the first light and the second light. Further, the inventors found that it is possible to prevent a second diffraction substrate from being transformed due to stress of a third diffraction grating layer by forming the third diffraction grating layer on one surface of a second diffraction substrate and forming a stress compensation layer on the other surface of the second diffraction substrate to develop a diffraction light guide plate and a manufacturing method thereof which will be described below.

Hereinafter, the present specification will be described in more detail.

An exemplary embodiment of the present invention provides a diffraction light guide plate, including: a first diffraction substrate; and a second diffraction substrate provided on the first diffraction substrate, in which the first diffraction substrate includes a first diffraction grating layer on one surface and a second diffraction grating layer on the other surface, the second diffraction substrate includes a third diffraction grating layer on one surface and a stress compensation layer on the other surface, the first diffraction grating layer separates light of a wavelength of 550 nm or more and 700 nm or less, the second diffraction grating layer separates light of a wavelength of 400 nm or more and 550 nm or less, the third diffraction grating layer separates light of a wavelength of 450 nm or more and 650 nm or less, and the stress compensation layer has stress in the same direction as that of stress of the third diffraction grating layer.

According to the exemplary embodiment of the present invention, the diffraction light guide plate includes the first diffraction substrate including the first diffraction grating layer on one surface and the second diffraction grating layer on the other surface, thereby effectively decreasing a thickness and weight of the diffraction light guide plate.

Further, according to the exemplary embodiment of the present invention, the stress compensation layer is formed on the other surface of the second diffraction substrate, which includes the third diffraction grating layer on one surface, thereby effectively suppressing transformation of the second diffraction substrate incurable due to the stress of the third diffraction grating layer.

A display unit implementing Augmented Reality (AR), Mixed Reality (MR), or Virtual Reality (VR) includes a diffraction light guide plate using a diffraction phenomenon based on a wave property of light. An existing diffraction light guide plate basically includes three substrates, which diffract light, and each of the three substrates is formed with a pattern layer including a grating pattern on one surface thereof. However, there is a problem in that the diffraction light guide plate in the related art including the three substrates, each of which is formed with the grating pattern on one surface, is thick and heavy. Further, the substrate formed with the pattern layer only on one surface may have a problem in that the substrate is transformed due to stress of the pattern layer.

FIGS. 1A and 1B are diagrams schematically illustrating the case where a substrate layer is transformed according to forming of a pattern layer on one surface of a substrate layer. Particularly, FIG. 1A is a diagram illustrating the case where compression stress is generated in a pattern layer 20 formed on one surface of a substrate layer 10, so that the substrate layer 10 provided with the pattern layer 20 is transformed. FIG. 1B is a diagram illustrating the case where tensile stress is generated in the pattern layer 20 formed on one surface of the substrate layer 10, so that the substrate layer 10 provided with the pattern layer 20 is transformed. In FIGS. 1A and 1B, a grating pattern included in the pattern layer 20 is omitted.

Compression stress or tensile stress may be generated in the pattern layer formed on one surface of the substrate layer by various elements, such as materials of the pattern layer and the substrate layer, a process condition of forming the pattern layer on the substrate layer, and the like. For example, thermal stress generated during a process of drying a composition and/or hardening a composition after the application of the composition for forming the pattern layer onto the substrate layer, or compression stress or tensile stress for a contraction behavior and the like of the composition applied onto the substrate layer may be formed in the pattern layer. As illustrated in FIGS. 1A and 1B, the substrate layer 10 may be transformed by the compression stress or the tensile stress generated in the pattern layer 20.

FIG. 2 is a diagram schematically illustrating a diffraction light guide plate including three substrate layers, each of which is formed with a pattern layer on one surface. Particularly, FIG. 2 is a diagram schematically illustrating a diffraction light guide plate including a first substrate layer 11 formed with a first pattern layer 21, a second substrate layer 12 formed with a second pattern layer 22, and a third substrate layer 13 formed with a third pattern layer 23. Referring to FIG. 2, in the case of the substrate layer formed with the pattern layer on only one surface, there may be a problem in that the substrate layer is transformed in a slightly curved form due to stress of the pattern layer. When the substrate layer formed with the pattern layer included in the diffraction light guide plate is curved as illustrated in FIG. 2, there may be a problem in that light transmittance is degraded due to partial scattering of light when light is incident to the diffraction light guide plate, and there may be a problem in that a quality of an image implementing a display unit including the diffraction light guide plate is degraded.

However, according to the exemplary embodiment of the present invention, the diffraction light guide plate includes the first diffraction substrate including the first diffraction grating layer on one surface and the second diffraction grating layer on the other surface, thereby effectively decreasing a thickness and weight of the diffraction light guide plate. That is, the diffraction light guide plate includes two substrates including the first diffraction substrate and the second diffraction substrate, thereby effectively lightening a display unit including the diffraction light guide plate. Further, a volume of a display unit including the diffraction light guide plate may be effectively decreased.

Further, according to the exemplary embodiment of the present invention, the stress compensation layer, which is capable of compensating for or offsetting stress of the third diffraction grating layer provided on one surface of the second diffraction substrate, is provided on the other surface of the second diffraction substrate, so that it is possible to effectively prevent the second diffraction substrate from being transformed due to the stress of the third diffraction grating layer.

According to the exemplary embodiment of the present invention, the stress compensation layer may have stress in the same direction as that of stress of the third diffraction grating layer. When compression stress is generated in the third diffraction grating layer, the stress compensation layer may have compression stress, and when tensile stress is generated in the third diffraction grating layer, the stress compensation layer may have tensile stress. Particularly, referring to FIG. 1A, when compression stress is generated in the third diffraction grating layer provided on one surface of the second diffraction substrate, tensile stress may be applied to the second diffraction substrate by the generated compression stress. In this case, when the stress compensation layer provided on the other surface of the second diffraction substrate has the compression stress in the same direction as that of the stress of the third diffraction grating layer, the tensile stress of the second diffraction substrate is offset, thereby preventing the second diffraction substrate from being transformed. Further, referring to FIG. 1B, in the case where tensile stress is generated in the third diffraction grating layer provided on one surface of the second diffraction substrate, compression stress may be applied to the second diffraction substrate by the generated tensile stress. In this case, when the stress compensation layer provided on the other surface of the second diffraction substrate has tensile stress in the same direction as that of the stress of the third diffraction grating layer, the compression stress of the second diffraction substrate is offset, thereby preventing the second diffraction substrate from being transformed.

Similarly, the second diffraction grating layer included on the other surface of the first diffraction substrate may have stress in the same direction as that of the stress of the first diffraction grating layer included on one surface of the first diffraction substrate. Accordingly, it is possible to prevent the first diffraction substrate from being transformed by the stress of the first diffraction grating layer.

Accordingly, according to the exemplary embodiment of the present invention, the first diffraction grating layer and the second diffraction grating layer are provided on one surface and the other surface of the first diffraction substrate, respectively, and the third diffraction grating layer and the stress compensation layer are provided on one surface and the other surface of the second diffraction substrate, respectively, thereby effectively preventing the first diffraction substrate and the second diffraction substrate from being transformed.

According to the exemplary embodiment of the present invention, the stress compensation layer may have the stress of 80% to 120% of the stress of the third diffraction grating layer. Particularly, the stress compensation layer may have the stress of 85% to 115%, 90% to 105%, 80% to 95%, 100% to 110%, or 100% to 105% of the stress of the third diffraction grating layer. Further, the stress compensation layer may have the stress having the same size as that of the stress of the third diffraction grating layer. The ratio of the stress of the stress compensation layer and the third diffraction grating layer is adjusted to have the foregoing range, thereby preventing the second diffraction substrate from being transformed to a curved form and the like.

When the stress of the stress compensation layer is less than 80% of the stress of the third diffraction grating layer, there is a problem in that it is difficult to effectively prevent the second diffraction substrate from being transformed due to the stress of the third diffraction grating layer. Further, when the stress of the stress compensation layer is larger than 120% of the stress of the third diffraction grating layer, there may be a problem in that the second diffraction substrate is rather transformed due to the stress of the stress compensation layer.

According to the exemplary embodiment of the present invention, it is possible to control the stress of the stress compensation layer so as to compensate for the stress of the third diffraction grating layer by adjusting a thickness of the stress compensation layer, a composition of the stress compensation layer, and the like. For example, the stress compensation layer having the composition and thickness, which are similar to or same as those of the third diffraction grating layer, may be provided on the other surface of the second diffraction substrate.

According to the exemplary embodiment of the present invention, the stress of the second diffraction grating layer may be 90% to 110% of the stress of the first diffraction grating layer. It is possible to effectively prevent the first diffraction substrate from being transformed by adjusting a ratio of the stress of the second diffraction grating layer and the stress of the first diffraction grating layer to the foregoing range.

According to the exemplary embodiment of the present invention, the degree of suppression of the transformation of the first diffraction substrate, in which the first diffraction grating layer is provided on one surface and the second diffraction grating layer is provided on the other surface, and the second diffraction substrate, in which the third diffraction grating layer is provided on one surface and the stress compensation layer is provided on the other surface, may be measured by equipment and a method of measuring a bending change of a film in the art. For example, shape change measurement equipment (FSM-6000LE) may be used. Further, the forms of the first diffraction substrate including the first diffraction grating layer and the second diffraction grating layer and the second diffraction substrate including the third diffraction grating layer and the stress compensation layer may be photographed in the form of a 3D image by using a 3D-coordinate measuring machine (3D-CMM) based on a principle of optical trigonometry. It is possible to check the degree of suppression of the transformation of the first diffraction substrate and the second diffraction substrate by analyzing the photographed 3D image.

According to the exemplary embodiment of the present invention, the stress compensation layer may include a reflection preventing pattern. The stress compensation layer includes the reflection preventing pattern, thereby effectively suppressing external light, which may be incident to the second diffraction substrate, from being reflected. Particularly, when a user uses a display unit including the second diffraction substrate, which is provided with the stress compensation layer including the reflection preventing pattern on the other surface, the reflection preventing pattern of the stress compensation layer may prevent light incident from the outside, in addition to image information provided to the diffraction light guide plate, from being reflected. Further, light transmittance of the second diffraction substrate, which includes the third diffraction grating layer on one surface and the stress compensation layer on the other surface, may be excellent.

According to the exemplary embodiment of the present invention, as the reflection preventing pattern, a reflection preventing pattern used in the art may be used. For example, in the present invention, as the reflection preventing pattern, a moth-eye pattern may be formed on a surface of the stress compensation layer.

According to the exemplary embodiment of the present invention, light transmittance of the second diffraction substrate, which includes the third diffraction grating layer on one surface and the stress compensation layer on the other surface, may be measured by using equipment and a method of measuring light transmittance of a film and the like in the art. For example, a light transmittance measuring device (HM-150) may be used.

According to the exemplary embodiment of the present invention, the first diffraction substrate may include the first diffraction grating layer on one surface and the second diffraction grating layer on the other surface, and the second diffraction substrate may include the third diffraction grating layer on one surface and the stress compensation layer on the other surface. That is, the first diffraction grating layer may be provided on one surface of the first diffraction substrate and the second diffraction grating layer may be provided on the other surface of the first diffraction substrate, and the third diffraction grating layer may be provided on one surface of the second diffraction substrate and the stress compensation layer may be provided on the other surface of the second diffraction substrate.

According to the exemplary embodiment of the present invention, the first diffraction substrate including the first diffraction grating layer and the second diffraction grating layer and the second diffraction substrate including the third diffraction grating layer and the stress compensation layer may guide light incident to the first diffraction substrate and the second diffraction substrate to one point through internal reflection or internal total reflection. Particularly, the light incident to the first diffraction substrate may be reflected or totally reflected inside the first diffraction substrate and be emitted to a different point from a point, at which the light is incident to the first diffraction substrate.

According to the exemplary embodiment of the present invention, a light refractive index of each of the first diffraction substrate and the second diffraction substrate may be 1.5 or more and less than 2.0. Particularly, each of the first diffraction substrate and the second diffraction substrate may have a light refractive index of 1.5 or more and less than 2.0 with respect to light having a wavelength of about 500 nm. Further, the light refractive indexes of the first diffraction substrate and the second diffraction substrate may be the same as or different from each other.

According to the exemplary embodiment of the present invention, as long as the first diffraction substrate and the second diffraction substrate have the light refractive index within the range, a substrate generally used in the art may be included as the first diffraction substrate and the second diffraction substrate. Particularly, glass or a resin film including a high refractive component, and the like may be used as the first diffraction substrate and the second diffraction substrate. The high refractive component may include at least one of TiO$_2$, Al$_2$O$_3$, Ga$_2$O$_3$, TeO$_2$, ZrO$_2$, Ta$_2$O$_5$, Nb$_2$O$_5$, and ZnS. However, the kinds of first diffraction substrate and second diffraction substrate are not limited thereto.

According to the exemplary embodiment of the present invention, one surface of the first diffraction substrate may face one surface or the other surface of the second diffraction substrate, or the other surface of the first diffraction substrate may face one surface or the other surface of the second diffraction substrate. Particularly, the second diffraction substrate may be provided on the first diffraction substrate so that the first diffraction grating layer included on one surface of the first diffraction substrate is adjacent to the third diffraction grating layer included on one surface of the second diffraction substrate. Further, the second diffraction substrate may be provided on the first diffraction substrate so that the first diffraction grating layer is adjacent to the stress compensation layer. Further, the second diffraction substrate may be provided on the first diffraction substrate so that the second diffraction grating layer is adjacent to the third diffraction grating layer, and the second diffraction substrate may be provided on the first diffraction substrate so that the second diffraction grating layer is adjacent to the stress compensation layer.

FIGS. 3A to 3D are diagrams schematically illustrating a diffraction light guide plate according to an exemplary embodiment of the present invention. Particularly, FIG. 3A is a diagram illustrating a diffraction light guide plate, in which a first diffraction substrate 100 provided with a first diffraction grating layer 310 on one surface and a second diffraction grating layer 320 on the other surface, and a second diffraction substrate 200 provided with a third diffraction grating layer 330 on one surface and a stress compensation layer 900 on the other surface are connected by a spacer 400, and the other surface of the first diffraction substrate 100 faces the other surface of the second diffraction substrate 200. FIG. 3B is a diagram illustrating a diffraction light guide plate, in which a first diffraction substrate 100 is connected with a second diffraction substrate 200 by a spacer 400 in a state where one surface of the first diffraction substrate 100 provided with a first diffraction grating layer 310 faces the other surface of the second diffraction substrate 200 provided with a stress compensation layer 900. FIG. 3C is a diagram illustrating a diffraction light guide plate, in which a first diffraction substrate 100 is connected with a second diffraction substrate 200 by a spacer 400 in a state where the other surface of the first diffraction substrate 100 provided with a second diffraction grating layer 320 faces one surface of the second diffraction substrate 200 provided with a third diffraction grating layer 330. FIG. 3D is a diagram illustrating a diffraction light guide plate, in which a first diffraction substrate 100 is connected with a second diffraction substrate 200 by a spacer 400 in a state where one surface of the first diffraction substrate 100 provided with a first diffraction grating layer 310 faces the other surface of the second diffraction substrate 200 provided with a stress compensation layer 900.

According to the exemplary embodiment of the present invention, the diffraction grating layer of the first diffraction substrate may be provided while being spaced apart from the second diffraction substrate. Particularly, the first diffraction substrate and the second diffraction substrate may be provided while being spaced apart from each other so that the first diffraction grating layer or the second diffraction grating layer is spaced apart from the third diffraction grating layer or the stress compensation layer. As illustrated in FIG. 3A, the second diffraction grating layer 320 of the first diffraction substrate 100 may be provided while being spaced apart from the stress compensation layer 900 of the second diffraction substrate 200. Further, as illustrated in FIG. 3B, the first diffraction grating layer 310 of the first diffraction substrate 100 may be provided while being spaced apart from the stress compensation layer 900 of the second diffraction substrate 200. Further, as illustrated in FIG. 3C, the second diffraction grating layer 320 of the first diffraction substrate 100 may be provided while being spaced apart from the third diffraction grating layer 330 of the second diffraction substrate 200. Further, as illustrated in FIG. 3D, the first diffraction grating layer 310 of the first diffraction substrate 100 may be provided while being spaced apart from the third diffraction grating layer 330 of the second diffraction substrate 200.

According to the exemplary embodiment of the present invention, the first diffraction substrate and the second diffraction substrate may be attached in the spaced state through the spacer. Referring to FIGS. 3A to 3D, one end portion of the first diffraction substrate 100 and one end portion of the second diffraction substrate 200, and the other end portion of the first diffraction substrate 100 and the other end portion of the second diffraction substrate 200 may be connected by the spacer 400. As the spacer, a publicly known configuration, which is capable of connecting the first diffraction substrate and the second diffraction substrate, may be used, and a configuration having elasticity may also be used as the spacer.

According to the exemplary embodiment of the present invention, a thickness of each of the first diffraction substrate and the second diffraction substrate may be 0.1 mm or more and 2 mm or less. In FIG. 3A, a thickness h1 of the first diffraction substrate 100 is indicated. A thickness of the first diffraction substrate may be 0.5 mm or more and 1.8 mm or less, 0.8 mm or more and 1.6 mm or less, 1 mm or more and 1.4 mm or less, 0.7 mm or more and 1 mm or less, 1.1 mm or more and 1.8 mm or less, or 1.3 mm or more and 1.5 mm or less. The first diffraction grating layer is provided on one surface of the first diffraction substrate having the foregoing thickness and the second diffraction grating layer is provided on the other surface of the first diffraction substrate, so that a gap between the first diffraction grating layer and the second diffraction grating layer may be adjusted to the foregoing range. The gap between the first diffraction grating layer and the second diffraction grating layer is adjusted to the foregoing range, so that the first diffraction substrate may more effectively discriminate and separate the first light and the second light from the incident light.

Further, a thickness of the second diffraction substrate may be 0.1 mm or more and 2 mm or less, and the thickness of the second diffraction substrate may be the same as or different from the thickness of the first diffraction substrate.

According to the exemplary embodiment of the present invention, the first diffraction grating layer may separate light of a wavelength of 550 nm or more and 700 nm or less, the second diffraction grating layer may separate light of a wavelength of 400 nm or more and 550 nm or less, and the third diffraction grating layer may separate light of a wavelength of 450 nm or more and 650 nm or less. Particularly, the first diffraction grating layer may separate the first light having a wavelength value of 550 nm or more and 700 nm or less from the light incident to the first diffraction grating layer. Further, the second diffraction grating layer may separate the second light having a wavelength value of 400 nm or more and 550 nm or less from the light incident to the second diffraction grating layer. Further, the third diffraction grating layer may separate third light having a wavelength value of 450 nm or more and 650 nm or less from the light incident to the third diffraction grating layer.

The wavelength values of the light separated in the first diffraction grating layer, the second diffraction grating layer, and the third diffraction grating layer may be measured by using equipment for measuring a wavelength value of light in the art. For example, the wavelength value of the light may be measured by using an optical wavelength meter (86120C, Agilent Technologies Company).

According to the exemplary embodiment of the present invention, when incident light including light having various wavelength values is emitted to the first diffraction grating layer 310 included on one surface of the first diffraction substrate 100 for the diffraction light guide plate including the first diffraction substrate 100 and the second diffraction substrate 200 as illustrated in FIG. 3A, the first diffraction grating layer 310 may separate the first light having the wavelength value of 550 nm or more and 700 nm or less from the incident light. Then, when the incident light passing through the first diffraction grating layer 310 is emitted to the second diffraction grating layer 320, the second diffraction grating layer 320 may separate second light having a wavelength value of 400 nm or more and 550 nm or less from the incident light. Then, when the incident light passing through the first diffraction grating layer 310 and the second diffraction grating layer 320 is emitted to the third diffraction grating layer 330, the third diffraction grating layer 320 may separate third light having a wavelength value of 450 nm or more and 650 nm or less from the incident light.

Further, when the incident light is emitted to the second diffraction grating layer 320 for the diffraction light guide plate including the first diffraction substrate 100 and the second diffraction substrate 200 as illustrated in FIG. 3B, the second diffraction grating layer 320 may separate second light from the incident light. Then, when the incident light passing through the second diffraction grating layer 320 is emitted to the first diffraction grating layer 310, the first diffraction grating layer 310 may separate first light from the incident light. Then, when the incident light passing through the second diffraction grating layer 320 and the first diffraction grating layer 310 is emitted to the third diffraction grating layer 330, the third diffraction grating layer 330 may separate third light from the incident light.

Further, in the diffraction light guide plates of FIGS. 3C and 3D, the first light, the second light, and the third light may be separated from the first incident light by the same scheme as those of the diffraction light guide plates of FIGS. 3A and 3B.

According to the exemplary embodiment of the present invention, the first diffraction substrate including the first diffraction grating layer on one surface and the second diffraction grating layer on the other surface may more effectively discriminate and separate the first light and the second light from the light incident to the first diffraction substrate. Particularly, the first diffraction substrate includes the first diffraction grating layer on one surface and the second diffraction grating layer on the other surface, and the first diffraction grating layer separates the first light having the wavelength value of 550 nm or more and 700 nm or less and the second diffraction grating layer separates the second light having the wavelength value of 400 nm or more and 550 nm or less, thereby preventing a cross talk phenomenon from being generated between the first light and the second light.

That is, the generation of the cross talk phenomenon between the first light separated in the first diffraction grating layer provided in the single first diffraction substrate and the second light separated in the second diffraction grating layer is prevented, so that it is possible to decrease a thickness and weight of the diffraction light guide plate and simultaneously improve light separation efficiency of the first diffraction substrate. Further, it is possible to improve light diffraction efficiency of the first diffraction substrate and effectively suppress a double image phenomenon and a chromatic dispersion phenomenon.

FIG. 4A is a diagram illustrating an in-coupling angle and an out-coupling angle of the first diffraction substrate provided with the first diffraction grating layer and the second diffraction grating layer according to the exemplary embodiment of the present invention, and FIG. 4B is a diagram illustrating an in-coupling angle and an out-coupling angle of the diffraction substrate provided with the first diffraction grating layer and the third diffraction grating layer. Particularly, FIG. 4A is a diagram illustrating an in-coupling angle and an out-coupling angle of the first diffraction substrate provided with the first diffraction grating layer and the second diffraction grating layer according to the exemplary embodiment of the present invention and is a drawing illustrating a reflection form of light incident to the first diffraction substrate within the substrate. Further, FIG. 4B is a diagram illustrating an in-coupling angle and an out-coupling angle of the diffraction substrate provided with the first diffraction grating layer and the third diffraction grating layer unlike the exemplary embodiment of the present invention, and is a drawing illustrating a reflection form of light incident to the diffraction substrate within the substrate.

Referring to FIG. 4A, in the case of the first diffraction substrate including the first diffraction grating layer, which separates light of a wavelength of 550 nm or more and 700 nm or less, and the second diffraction grating layer, which separates light of a wavelength of 400 nm or more and 550 nm or less, according to the exemplary embodiment of the present invention, it is confirmed that the cross talk phenomenon is not generated in the first diffraction substrate, so that a double image is not generated in a field of view and the diffraction of light is generated as set in the first diffraction substrate. In the meantime, referring to FIG. 4B, in the case of the diffraction substrate including the first diffraction grating layer, which separates light of a wavelength of 550 nm or more and 700 nm or less, and the third diffraction grating layer, which separates light of a wavelength of 450 nm or more and 650 nm or less, it is confirmed that the cross talk phenomenon is generated in the diffraction substrate, a double image and a chromatic dispersion phenomenon are generated in a field of view by the cross talk phenomenon, and the diffraction of light different from the set diffraction is generated within the diffraction substrate.

In this case, the in-coupling angles and the out-coupling angles of the diffraction substrates of FIGS. 4A and 4B may be measured by using a device and/or a method of simulating an in-coupling angle and an out-coupling angle of a diffraction substrate used in the art.

In the present invention, an in-coupling angle and an out-coupling angle of a diffraction substrate may be simulated by using Equation 1 below.

$$\sin(\theta in) - \sin(\theta out) = \lambda(1/b - 1/a) \quad \text{[Equation 1]}$$

In Equation 1, $\theta_{in}$ means an in-coupling angle, and $\theta_{out}$ means an out-coupling angle. Further, in Equation 1, $\lambda$ is a wavelength, a is a pitch of a diffraction lattice diffracting incident light into the diffraction substrate, and b is a pitch of a diffraction lattice diffracting the light inside the diffraction substrate at an angle of emitted light. When in-coupling and out-coupling are generated on the same surface, that is, a=b, angles of incident light and emitted light are identically represented as white circles positioned in the field of view in FIGS. 4A and 4B. In the meantime, when in-coupling and out-coupling are generated in different surfaces, that is, a≠b, an in-coupling angle and an out-coupling angle are different, and an in-coupling angle and an out-coupling angle are also different according to a wavelength, so that chromatic dispersion is generated. FIG. 4A is a result obtained by calculating an out-coupling angle according to an in-coupling angle when a is 468 nm and b is 405 nm or a is 405 nm and b is 468 nm, and is expressed with a color corresponding to each wavelength. FIG. 4B is a result obtained by calculating an out-coupling angle according to an in-coupling angle when a is 468 nm and b is 340 nm or a is 304 nm and b is 468 nm, and is expressed with a color corresponding to each wavelength.

According to the exemplary embodiment of the present invention, a light refractive index of each of the first diffraction grating layer to the third diffractive grating layer may be 1.5 or more and less than 2. Each of the first diffraction grating layer to the third diffraction grating layer may have a light refractive index of 1.5 or more and less than 2.0 with respect to light having a wavelength of about 500 nm.

Particularly, a light refractive index of each of the first diffraction lattice layer to the third diffraction lattice layer may be 1.55 or more and 1.9 or less, 1.6 or more and 1.8 or less, 1.7 or more and 1.8 or less, 1.5 or more and 1.8 or less, or 1.55 or more and 1.75 or less.

Each of the first diffraction grating layer, the second diffraction grating layer, and the third diffraction grating layer having the light refractive indexes of the range may have excellent diffraction performance for the incident light. When the light refractive index of each of the first diffraction grating layer to the third diffraction grating layer is 2 or more, there may occur a problem in that secondary diffraction is generated, and when the light refractive index of each of the first diffraction grating layer to the third diffraction grating layer is less than 1.5, there may incurred a problem in that light diffraction efficiency of the diffraction light guide plate is decreased.

Further, the light refractive indexes of the first diffraction grating layer, the second diffraction grating layer, and the third diffraction grating layer may be the same as or different from one another.

According to the exemplary embodiment of the present invention, the light refractive index of the diffraction grating layer, the light refractive index of the diffraction substrate, and the like may be measured by using a method of measuring a light refractive index generally used in the art. For example, a light refractive index may be measured by using a prism coupler (SPA-4000) or ellipsometer.

According to the exemplary embodiment of the present invention, each of the first diffraction grating layer, the second diffraction grating layer, and the third diffraction grating layer may include at least one high refractive component among $TiO_2$, $Al_2O_3$, $Ga_2O_3$, $TeO_2$, $ZrO_2$, $Ta_2O_5$ $Nb_2O_5$, ZnS, HfO, MoO, and CuO. However, the high refractive component included in the first diffraction grating layer, the second diffraction grating layer, and the third diffraction grating layer is not limited. The light refractive index of the diffraction grating layer may be controlled by adjusting a content, the kind, and the like of the high refractive component included in the diffraction grating layer.

According to the exemplary embodiment of the present invention, each of the first diffraction grating layer, the second diffraction grating layer, and the third diffraction grating layer may include a thermosetting resin or a photo-curable resin containing the high refractive component. Particularly, a thermosetting resin or a photo-curable resin may include an acrylic resin, such as urethane acrylate and epoxy acrylate, a polyamide resin, a polyimide resin, a silicon resin, an epoxy resin, a polyester resin, and the like, but the kind thereof is not limited.

According to the exemplary embodiment of the present invention, the light refractive indexes of the first diffraction grating layer and the second diffraction grating layer may be the same as or different from the light refractive index of the first diffraction substrate. Further, the light refractive index of the third diffraction grating layer may be the same as or different from the light refractive index of the second diffraction substrate.

According to the exemplary embodiment of the present invention, the stress compensation layer may include a thermosetting resin or a photo-curable resin. Particularly, a thermosetting resin or a photo-curable resin may include an acrylic resin, such as urethane acrylate and epoxy acrylate, a polyamide resin, a polyimide resin, a silicon resin, an epoxy resin, a polyester resin, and the like, but the kind thereof is not limited. Further, the stress compensation layer may include the thermosetting resin or the photo-curable resin containing a high refractive particle. The high refractive component may include at least one of $TiO_2$, $Al_2O_3$, $Ga_2O_3$, $TeO_2$, $ZrO_2$, $Ta_2O_5$ $Nb_2O_5$, ZnS, HfO, MoO, and CuO.

According to the exemplary embodiment of the present invention, each of the first diffraction grating layer to the third diffraction grating layer may include a first area, into which light is incident, a second area, in which the incident light is expanded and moves, and a third area, through which the moved light is extracted, and the first area may be included in a corresponding position of each of the first diffraction grating layer to the third diffraction grating layer and the third area may be included in a corresponding position of each of the first diffraction grating layer to the third diffraction grating layer.

FIG. 5 is a diagram schematically illustrating a plane of the first diffraction grating layer according to the exemplary embodiment of the present invention. Particularly, FIG. 5 is a diagram illustrating a plane of the first diffraction grating layer 310 including a first area 511, into which light is incident, a second area 512, in which the incident light is expanded and moves, and a third area 513, through which the moved light is extracted. As illustrated in FIG. 5, the first area 511 to the third area 513 may be sequentially provided in a direction from one side A to the other side B of the first diffraction grating layer 310. In this case, in FIG. 5, the illustration of a pattern structure of the first diffraction grating layer is omitted.

Referring to FIG. 5, the first area 511 may be the area, into which incident light including light having various wavelength values is incident. Further, the second area 512 may be the area, in which the light incident to the first diffraction grating layer 310 is diffracted, and may be the area, in which the light incident to the first area 511 is expanded to the third area 513. The third area 513 may be the area, through which the light is extracted, and when the diffraction light guide plate is used in a display unit, the third area 513 may be the area, through which light is extracted to provide display information to the user. In addition, similar to the first diffraction grating layer illustrated in FIG. 5, each of the second diffraction grating layer and the third diffraction grating layer may also include the first area to the third area.

FIG. 6 is a diagram schematically illustrating a cross-section of the first diffraction substrate including the first diffraction grating layer according to the exemplary embodiment of the present invention. Particularly, FIG. 6 is a diagram illustrating the case where light is incident to the first area 511 and then is extracted through the third area 513 to provide a user with display information. In FIG. 6, the illustration of the second diffraction grating layer and the second diffraction substrate included on the other surface of the first diffraction substrate is omitted. In FIG. 6, the second diffraction grating layer included on the other surface of the first diffraction substrate is omitted. Further, as illustrated in FIG. 6, even in the second diffraction grating layer and the third diffraction grating layer, the light incident to the first area may be extracted through the third area.

According to the exemplary embodiment of the present invention, each of the first diffraction grating layer to the third diffraction grating layer may include a diffraction pattern. The diffraction pattern may include two or more pattern structures.

FIG. 7 is a diagram schematically illustrating the first diffraction grating layer including a diffraction pattern according to the exemplary embodiment of the present invention. Particularly, FIG. 7 is a diagram illustrating a diffraction pattern including two or more pattern structures provided in a direction from one side A to the other side B of the first diffraction grating layer 310. In FIG. 7, the illustration of the second diffraction grating layer included on the other surface of the first diffraction substrate is omitted. Identically to the illustration of FIG. 7, each of the second diffraction grating layer and the third diffraction grating layer may include a diffraction pattern including two or more pattern structures provided in the direction from one side to the other side of the diffraction grating layer.

According to the exemplary embodiment of the present invention, according to the form of the diffraction pattern included in each of the first diffraction grating layer to the third diffraction grating layer, wavelength values of the light separated from the light incident to the first diffraction grating layer, the second diffraction grating layer, and the third diffraction grating layer may be different.

FIG. 8 is a diagram schematically illustrating a cross-section of the diffraction pattern included in the first diffraction grating layer according to the exemplary embodiment of the present invention. Particularly, FIG. 8 is a diagram illustrating a diffraction pattern including two or more pattern structures. In FIG. 8, the second diffraction grating layer included on the other surface of the first diffraction substrate is omitted. Referring to FIG. 8, the pattern structure is provided from one surface of the first diffraction substrate 100 at an angle θ1 of inclination, the pattern structure may have a depth of h2 and the two or more pattern structures may be provided with a pitch of d1. In the present invention, the "pitch" means an interval, by which the pattern structure is repeated, and may mean a length between one point of one pattern structure and one point of another pattern structure adjacent to the one pattern structure as illustrated in FIG. 8. One point of one pattern structure and one point of another pattern structure may mean corresponding positions between the pattern structures.

Referring to FIG. 8, the pattern structure included in the diffraction pattern of the first diffraction grating layer 310 according to the exemplary embodiment of the present invention may be provided from one surface of the first diffraction substrate 100 at an angle θ1 of inclination of 50° or more and less than 90°. Further, the two or more pattern structures may be provided with a pitch d1 of 100 nm or more and 600 nm or less, and a depth h2 of the pattern structure may be larger than 0 nm and 600 nm or less. Particularly, the angle of inclination of the pattern structure included in the first diffraction grating layer with respect to the first diffraction substrate may be 55° or more and 80° or less, 60° or more and 75° or less, 65° or more and 85° or less, 50° or more and 65° or less, or 70° or more and 80° or less. Further, the two or more pattern structures may be provided with a pitch of 150 nm or more and 500 nm or less, 200 nm or more and 400 nm or less, 250 nm or more and 350 nm or less, 150 nm or more and 250 nm or less, 350 nm or more and 450 nm or less, or 500 nm or more and 600 nm or less. Further, the depth of the pattern structure may be 10 nm or more and 500 nm or less, 50 nm or more and 400 nm or less, 100 nm or more and 350 nm or less, 150 nm or more and 250 nm or less, 450 nm or more and 550 nm or less, or 300 nm or more and 400 nm or less.

According to the exemplary embodiment of the present invention, similar to the first diffraction grating layer, each of the second diffraction grating layer and the third diffraction grating layer may include two or more pattern structures, and the pattern structure may be provided from one surface of the diffraction substrate at an angle of inclination of 50° or more and less than 90°. Further, the two or more pattern structures may be provided with a pitch of 100 nm or more and 600 nm or less, and a depth of the pattern structure may be larger than 0 nm and 600 nm or less. Particularly, the angle of inclination of the pattern structure included in each of the second diffraction grating layer and the third diffraction grating layer with respect to one surface of the diffraction substrate may be 50° or more and 80° or less, 55° or more and 70° or less, 65° or more and 75° or less, or 70° or more and 80° or less. Further, the two or more pattern structures may be provided with a pitch of 125 nm or more and 450 nm or less, 250 nm or more and 350 nm or less, 200 nm or more and 400 nm or less, 150 nm or more and 300 nm or less, 350 nm or more and 400 nm or less, or 500 nm or more and 655 nm or less. Further, the depth of the pattern structure may be 30 nm or more and 500 nm or less, 100 nm or more and 400 nm or less, 150 nm or more and 300 nm or less, 200 nm or more and 250 nm or less, 450 nm or more and 550 nm or less, or 300 nm or more and 400 nm or less.

According to the exemplary embodiment of the present invention, the forms of the diffraction patterns included in the first diffraction grating layer, the second diffraction grating layer, and the third diffraction grating layer may be different. For example, the pitch of the pattern structure included in the diffraction pattern of the first diffraction grating layer is the same as the pitch of the pattern structure included in the diffraction pattern of the second diffraction grating layer, but the angle of inclination and the depth of the pattern structure included in the diffraction pattern of the first diffraction grating layer may be different from the angle of inclination and the depth of the pattern structure included in the diffraction pattern of the second diffraction grating layer. Further, the depth of the pattern structure included in the diffraction pattern of the second diffraction grating layer is the same as the depth of the pattern structure included in the diffraction pattern of the third diffraction grating layer, but the angle of inclination of the grating of the pattern structure included in the diffraction pattern of the second diffraction grating layer may be different from the angle of inclination of the grating of the pattern structure included in the diffraction pattern of the third diffraction grating layer.

Accordingly, according to the exemplary embodiment of the present invention, it is possible to easily control the wavelength value of light separated from the light incident to the diffraction grating layer by adjusting the angle of inclination of the pattern structure included in the diffraction pattern of the diffraction grating layer with respect to the diffraction substrate, the pitch between the pattern structures, and the depth of the pattern structure.

FIGS. 9A to 9C plot simulation results of light diffraction efficiency of the diffraction grating layer according to duty, a depth, and a light refractive index of a pattern structure included in the diffraction grating layer according to the exemplary embodiment of the present invention. Particularly, FIG. 9A plots the simulation result of light diffraction efficiency of the diffraction grating layer according to duty of the pattern structure, in which a light refractive index n of the diffraction grating layer is set to 1.8 and a depth of the diffraction grating layer is set to 300 nm. In addition, FIG. 9B plots the simulation result of light diffraction efficiency of the diffraction grating layer according to a depth of the pattern structure, in which a light refractive index n of the diffraction grating layer is set to 1.8 and duty of the diffraction grating layer is set to 0.6. In addition, FIG. 9C plots the simulation result of light diffraction efficiency of the diffraction grating layer according to a light refractive index of the pattern structure, in which duty of the diffraction grating layer is set to 0.6 and a depth of the diffraction grating layer is set to 300 nm.

Referring to FIGS. 9A to 9C, it can be seen that it is possible to easily control light diffraction efficiency of the diffraction grating layer by adjusting the duty and the depth of the pattern structure included in the diffraction grating layer, and the light refractive index of the diffraction grating layer according to the exemplary embodiment of the present invention.

In this case, the simulations in FIGS. 9A to 9C may be calculated by using a device and/or a method of calculating light diffraction efficiency of a diffraction substrate used in the art, and may be calculated by using VirtualLab SoftWare using the rigorous coupled wave analysis algorithm in the present invention.

FIGS. 10A and 10B are diagrams schematically illustrating cross-sections of the diffraction light guide plates including the first diffraction grating layer to the third diffraction grating layer according to the exemplary embodiment of the present invention. Particularly, FIG. 10A is a diagram illustrating first diffraction patterns 311, 321, and 331 included in the first areas 511, 521, and 531 of the first diffraction grating layer 310, the second diffraction grating layer 320, and the third diffraction grating layer 330, respectively, second diffraction patterns 312, 322, and 332 included in the second areas 512, 522, and 532 of the first diffraction grating layer 310, the second diffraction grating layer 320, and the third diffraction grating layer 330, respectively, and third diffraction patterns 313, 323, and 333 included in the third areas 513, 523, and 533 of the first diffraction grating layer 310, the second diffraction grating layer 320, and the third diffraction grating layer 330, respectively. Further, FIG. 10B is a diagram illustrating first diffraction patterns 311 and 321 included in the first areas 511 and 521 of the first diffraction grating layer 310 and the second diffraction grating layer 320, respectively, second diffraction patterns 312 and 322 included in the second areas 512 and 522 of the first diffraction grating layer 310 and the second diffraction grating layer 320, respectively, and third diffraction patterns 313 and 323 included in the third areas 513 and 523 of the first diffraction grating layer 310 and the second diffraction grating layer 320, respectively, and is a diagram illustrating the diffraction light guide plate including the first diffraction pattern 331 included in the first area 531 of the third diffraction grating layer 330, the third diffraction pattern 333 included in the third area 533, and the second diffraction grating patterns 332 and 332' included in the two second areas 532 and 532', respectively.

According to the exemplary embodiment of the present invention, the first area may be included in a corresponding position of each of the first diffraction grating layer to the third diffraction grating layer, and the third area may be included in a corresponding position of each of the first diffraction grating layer to the third diffraction grating layer. That is, the first area included in each of the first diffraction grating layer to the third diffraction grating layer may be aligned so as to be provided at the corresponding position of each of the first diffraction grating layer to the third diffraction grating layer. Further, the third area included in each of the first diffraction grating layer to the third diffraction grating layer may be aligned so as to be provided at the corresponding position of each of the first diffraction grating layer to the third diffraction grating layer.

According to the exemplary embodiment of the present invention, the position, at which the first area of the first diffraction grating layer is provided, the position, at which the first area of the second diffraction grating layer is provided, and the position, at which the first area of the third diffraction grating layer is provided, may correspond to one another. Particularly, the positions of the first diffraction grating layer to the third diffraction grating layer including the first area may be the same, and the positions of the first diffraction grating layer to the third diffraction grating layer including the third area may be the same.

According to the exemplary embodiment of the present invention, the position, at which the first area of the first diffraction grating layer is provided, may correspond to the position, at which the first area of the second diffraction grating layer is provided, the position, at which the first area of the second diffraction grating layer is provided, may correspond to the position, at which the first area of the third diffraction grating layer is provided, and the position, at which the first area of the first diffraction grating layer is provided, may correspond to the position, at which the first area of the third diffraction grating layer is provided.

Further, the position, at which the third area of the first diffraction grating layer is provided, the position, at which the third area of the second diffraction grating layer is provided, and the position, at which the third area of the third diffraction grating layer is provided, may correspond to one another. That is, the position, at which the third area of the first diffraction grating layer is provided, may correspond to the position, at which the third area of the second diffraction grating layer is provided, the position, at which the third area of the second diffraction grating layer is provided, may correspond to the position, at which the third area of the third diffraction grating layer is provided, and the position, at which the third area of the first diffraction grating layer is provided, may correspond to the position, at which the third area of the third diffraction grating layer is provided. The positions of the third areas included in the first diffraction grating layer to the third diffraction grating layer correspond to one another, so that the first light separated from the first diffraction grating layer, the second light separated from the second diffraction grating layer, and the third light separated from the third diffraction grating layer may be effectively combined.

Further, the areas of the first areas and the areas of the third areas, which are aligned so as to correspond to one another in the first diffraction grating layer to the third diffraction grating layer, respectively, may be substantially the same. In the present invention, "the areas are substantially the same" may mean the case where the areas including a minor error generable during the manufacturing are the same, as well as the case where the areas are accurately the same.

Referring to FIGS. 10A and 10B, the positions including the first areas 511, 521, and 531 included in the first diffraction grating layer 310, the second diffraction grating layer 320, and the third diffraction grating layer 330, respectively, may correspond to one another. Further, the positions including the third areas 513, 523, and 533 included in the first diffraction grating layer 310, the second diffraction grating layer 320, and the third diffraction grating layer 330, respectively, may correspond to one another. That is, the first area and the third area included in each of the first diffraction grating layer to the third diffraction grating layer may be provided at corresponding positions of each of the first diffraction grating layer to the third diffraction grating layer. Further, the first area included in each of the first diffraction grating layer to the third diffraction grating layer may substantially have the same area, and the third area included in each of the first diffraction grating layer to the third diffraction grating layer may substantially have the same area. The first area and the third area included in each of the first diffraction grating layer, the second diffraction grating layer, and the third diffraction grating layer are formed at the corresponding positions, so that it is possible to improve a quality, such as definition, of an image implemented by a display unit, to which the diffraction light guide plate is applied.

In the meantime, according to the exemplary embodiment of the present invention, the second areas included in the first diffraction grating layer, the second diffraction grating layer, and the third diffraction grating layer may be provided at the corresponding positions or may be provided at different positions. Referring to FIG. 10A, the second areas 512, 522, and 532 included in the first diffraction grating layer 310, the second diffraction grating layer 320, and the third diffraction grating layer 330 may be provided at the corresponding positions. Further, referring to FIG. 10B, the formed position and the area of the second area 512 provided in the first diffraction grating layer 310 may be different from the formed position and the area of the third area 532 included in the third diffraction grating layer 320.

According to the exemplary embodiment of the present invention, each of the first diffraction grating layer to the third diffraction grating layer may include the first area and the third area, and may selectively include the second area. For example, each of the first diffraction grating layer and the third diffraction grating layer may include the first area to the third area, and the second diffraction grating layer may include only the first area and the third area.

According to the exemplary embodiment of the present invention, the number of first areas, second areas, and third areas included in each of the first diffraction grating layer, the second diffraction grating layer, and the third diffraction grating layer may be plural. For example, the third diffraction grating layer may include one first area, two second areas, and one third area. Referring to FIG. 10B, the third diffraction grating layer 330 may include two second areas 532 and 532', and the two second areas 532 and 532' may include the second diffraction patterns 332 and 332', respectively.

According to the exemplary embodiment of the present invention, the first diffraction pattern, the second diffraction pattern, and the third diffraction pattern included in each of the first diffraction grating layer to the third diffraction grating layer may have different forms. For example, the pattern structure included in the first diffraction pattern of the first diffraction grating layer may have different inclination direction, angle of inclination, depth, width, and the like from those of the pattern structure included in the second diffraction pattern of the first diffraction grating layer. Further, the pattern structure included in the first diffraction pattern of the first diffraction grating layer may have different inclination direction, angle of inclination, depth, width, and the like from those of the pattern structure included in the first diffraction pattern of the second diffraction grating layer.

FIG. 11 is a diagram schematically illustrating the first diffraction grating layer including the first diffraction pattern to the third diffraction pattern according to the exemplary embodiment of the present invention. Particularly, FIG. 11 is a diagram illustrating the first diffraction grating layer 310, in which inclination directions, angles of inclination, pitches, and depths of the pattern structure included in the first diffraction pattern 311, the pattern structure included in the second diffraction pattern 312, and the pattern structure included in the third diffraction pattern 313 are different. In FIG. 11, the illustration of the second diffraction grating layer included on the other surface of the first diffraction substrate is omitted.

Referring to FIG. 11, it is possible to improve efficiency of the separation of the first light from the light incident to the first diffraction grating layer and efficiency of the diffraction of light with respect to the first diffraction substrate by adjusting the inclination directions and the angles of inclination of the pattern structures included in the first diffraction pattern 311, the second diffraction pattern 312, and the third diffraction pattern 313 of the first diffraction grating layer 310 with respect to the diffraction substrate, the pitches of the pattern structures, and the depths of the pattern structures. Further, similar to the first diffraction grating layer, the inclination directions and the angles of inclination of the pattern structures included in the first diffraction patterns, the second diffraction patterns, and the third diffraction patterns of the second diffraction grating layer and the third diffraction grating layer, the pitches of the pattern structures, and the depth of the pattern structures may be adjusted.

Accordingly, according to the exemplary embodiment of the present invention, it is possible to provide a diffraction light guide plate, with which a display capable of implementing a clear image is manufactured, by adjusting the angle of inclination, the pitch, the depth, and the like of the pattern structure included in the diffraction pattern of the diffraction grating layer.

According to the exemplary embodiment of the present invention, a light refractive index of the third area included in each of the first diffraction grating layer to the third diffraction grating layer may be gradually increased from one side to the other side.

In the case of the diffraction light guide plate in the related art, light diffraction efficiency is the same throughout the entire areas, from which light is extracted to provide display information to a user. When the light diffraction efficiency is the same in the entire portions of the area included in the diffraction light guide plate, in which light is diffracted, the amount of light diffracted by the diffraction light guide plate is decreased in the process of reflecting or totally reflecting light inside the diffraction light guide plate. Particularly, when light is incident to one side surface of the diffraction light guide plate and is guided to the other side surface of the diffraction light guide plate, the amount of light diffracted in the diffraction area is decreased from one side surface to the other side surface of the diffraction light guide plate. When the amount of light diffracted is different according to a portion of the diffraction light guide plate, light having high luminosity is emitted in the portion, in which the amount of light diffracted is large, but light having low luminosity is emitted in the portion, in which the amount of light diffracted is small. Accordingly, in the case of the diffraction light guide plate in the related art, the light diffraction efficiency is the same throughout the entire areas, from which light is extracted, so that there may be a problem in that luminosity of the extracted light is not uniform according to the portion of the area, from which light is extracted.

In the meantime, according to the exemplary embodiment of the present invention, the light refractive index of the third area of each of the first diffraction grating layer to the third diffraction grating layer may be gradually increased from one side to the other side. The third area may be the area, through which light is extracted, and the light refractive index of the third area is gradually increased from one side to the other side, so that luminosity of the extracted light may be uniform according to the portion of the third area. Accordingly, according to the exemplary embodiment of the present invention, it is possible to implement a diffraction light guide plate, which is capable of providing display information having the same luminosity to a user.

Further, similar to the third area, the light refractive index of the first area and/or the second area included in each of the first diffraction grating layer to the third diffraction grating layer may be gradually increased from one side to the other side.

According to the exemplary embodiment of the present invention, the third area may include a diffraction pattern including an inclined pattern structure, of which a depth is gradually increased from one side to the other side. Particularly, the third area includes the diffraction pattern including the inclined pattern structure, of which the depth is gradually increased from one side to the other side, so that it is possible to gradually increase the light refractive index from one side to the other side of the third area. Referring to FIG. 11, the diffraction pattern including the inclined pattern structure, of which the depth is gradually increased in a direction from one side A to the other side B of the third area 513, is included in the third area, so that the light refractive index may be gradually increased from the direction from one side to the other side of the third area. The light refractive index is gradually increased from one side to the other side of the third area, so that light diffraction efficiency may be gradually increased from one side to the other side of the third area.

Accordingly, according to the exemplary embodiment of the present invention, the decrease in the amount of light is prevented during the process, in which light is diffracted from the direction from one side to the other side of the third area by gradually increasing the depth of the inclined pattern structure included in the third area of each of the first diffraction grating layer to the third diffraction grating layer in the direction from one side to the other side of the third area, so that luminosity of the light emitted from each portion of the third area may be uniform.

Further, similar to the third area, the first area and/or the second area included in each of the first diffraction grating layer to the third diffraction grating layer may include the diffraction pattern including the inclined pattern structure, of which a depth is gradually increased from one side to the other side.

According to the exemplary embodiment of the present invention, the third area may include the pattern structure, of which duty is gradually increased from one side to the other side. In the present invention, the "duty" may mean a value (a width of the pattern structure/a pitch of the pattern structure) obtained by dividing a value of a width of the pattern structure by a pitch of the pattern structure. Referring to FIG. 8, the duty of the pattern structure may be a value (d2/d1) obtained by dividing a width d2 of the pattern structure by a pitch d1 of the pattern structure.

According to the exemplary embodiment of the present invention, the third area includes the pattern structure, of which the duty is gradually increased from one side to the other side, so that it is possible to gradually increase the light refractive index from one side to the other side of the third area. The duty of the pattern structure is gradually increased from one side to the other side of the third area, so that the light refractive index may be gradually increased in a direction from one side to the other side of the third area. The light refractive index is gradually increased from one side to the other side of the third area, so that light diffraction efficiency may be gradually increased from one side to the other side of the third area. For example, the duty of the pattern structure may be gradually increased in the direction from one side to the other side of the third area by setting the pitches of the pattern structures to be the same and gradually increasing the width of the pattern structure.

According to the exemplary embodiment of the present invention, the duty of the pattern structure included in the third area may be 0.1 or more and 1.0 or less. It is possible to implement the third area having excellent light diffraction efficiency by adjusting the duty of the pattern structure included in the third area to the foregoing range.

According to the exemplary embodiment of the present invention, it is possible to gradually increase the duty of the pattern structure from one side to the other side of the third area by setting the pitches of the two or more pattern structures to be the same and gradually increasing the width of the pattern structure in the direction from one side to the other side of the third area.

Further, similar to the third area, the first area and/or the second area included in each of the first diffraction grating layer to the third diffraction grating layer may include the pattern structure, of which the duty is gradually increased from one side to the other side.

Further, another exemplary embodiment of the present invention provides a method of manufacturing a diffraction light guide plate.

An exemplary embodiment of the present invention provides a method of manufacturing a diffraction light guide plate according to an exemplary embodiment of the present invention, the method including: preparing a first diffraction substrate including a first diffraction grating layer on one surface and a second diffraction grating layer on the other surface; preparing a second diffraction substrate including a third diffraction grating layer on one surface and a stress compensation layer on the other surface; and attaching the first diffraction substrate and the second diffraction substrate.

According to the exemplary embodiment of the present invention, it is possible to easily manufacture the diffraction light guide plate, of which a thickness and weight are decreased.

Further, according to the exemplary embodiment of the present invention, it is possible to easily manufacture the diffraction light guide plate including the first diffraction substrate and the second diffraction substrate, in which bending is prevented.

The first diffraction substrate, the second diffraction substrate, the first diffraction grating layer, the second diffraction grating layer, the third diffraction grating layer, and the stress compensation layer manufactured by the method of manufacturing the diffraction light guide plate according to the exemplary embodiment of the present invention may be substantially the same as the first diffraction substrate, the second diffraction substrate, the first diffraction grating layer, the second diffraction grating layer, the third diffraction grating layer, and the stress compensation layer included in the diffraction light guide plate according to the exemplary embodiment of the present invention.

According to the exemplary embodiment of the present invention, the operation of preparing the first diffraction substrate may include forming the first diffraction grating layer on one surface of a first substrate and forming the second diffraction grating layer on the other surface of the first substrate to manufacture the first diffraction substrate. Particularly, after the first diffraction grating layer is formed on one surface of the first substrate, the second diffraction grating layer may be formed on the other surface of the first substrate. Further, the first diffraction grating layer and the second diffraction grating layer may also be simultaneously formed on one surface and the other surface of the first substrate.

According to the exemplary embodiment of the present invention, the operation of preparing the first diffraction substrate may include bonding a first substrate provided with the first diffraction grating layer on one surface and an additional substrate provided with the second diffraction grating layer on one surface to manufacture a first diffraction substrate. Particularly, the first diffraction grating layer is formed on one surface of the first substrate and the second diffraction grating layer is formed on one surface of the additional substrate, and the other surface of the first substrate is bonded to the other surface of the additional substrate to manufacture the first diffraction substrate.

According to the exemplary embodiment of the present invention, the other surface of the first substrate and the other surface of the additional substrate may be bonded through an adhesive layer. The adhesive layer may have a light refractive index of 1.5 or more and less than 2.0. It is possible to manufacture the first diffraction substrate having excellent light diffraction efficiency by bonding the first substrate and the additional substrate by using the adhesive layer having the light refractive index within the foregoing range.

According to the exemplary embodiment of the present invention, the adhesive layer may include an adhesive film or an adhesive agent. Particularly, an adhesive film having the foregoing light refractive index may be used, and an adhesive agent forming an adhesive layer having the foregoing light refractive index may be used.

According to the exemplary embodiment of the present invention, in the operation of preparing the second diffraction substrate, the third diffraction grating layer is formed on one surface of the second substrate and the stress compensation layer is formed on the other surface of the second substrate to manufacture the second diffraction substrate. Particularly, after the third diffraction grating layer is formed on one surface of the second substrate, the stress compensation layer may be formed on the other surface of the second substrate. Further, the third diffraction grating layer and the stress compensation layer may also be simultaneously formed on one surface and the other surface of the second substrate.

According to the exemplary embodiment of the present invention, in the operation of preparing the second diffraction substrate, the second diffraction substrate may be manufactured by bonding the second substrate, which is provided with the third diffraction grating layer on one surface, and the additional substrate, which is provided with the stress compensation layer on one surface. Particularly, the third diffraction grating layer is formed on one surface of the second substrate, the stress compensation layer is formed on one surface of the additional substrate, and then the other surface of the second substrate is bonded to the other surface of the additional substrate to manufacture the second diffraction substrate.

According to the exemplary embodiment of the present invention, the other surface of the second substrate and the other surface of the additional substrate may be bonded through an adhesive layer. The adhesive layer, through which the other surface of the second substrate is bonded to the other surface of the additional substrate, may be the same as the adhesive layer, through which the other surface of the first substrate is bonded to the other surface of the additional substrate.

According to the exemplary embodiment of the present invention, in the operation of preparing the second diffraction substrate, it is possible to form a reflection preventing pattern on the stress compensation layer. The reflection preventing pattern is formed on the stress compensation layer, thereby effectively suppressing reflection of external light, which may be incident to the second diffraction substrate. Further, as the reflection preventing pattern, a reflection preventing pattern used in the art may be used. For example, in the present invention, as the reflection preventing pattern, a moth-eye pattern may be formed on a surface of the stress compensation layer.

According to the exemplary embodiment of the present invention, each of the first diffraction grating layer to the third diffraction grating layer and the stress compensation layer may be formed by using an imprinting process using a photo curable resin composition and an imprinting mold.

According to the exemplary embodiment of the present invention, the operation of preparing the first diffraction substrate may include applying a photo-curable resin composition on the first substrate and performing imprinting on a surface of the photo-curable resin composition by using a mold having a surface, in which a diffraction pattern is engraved. Then, the photo-curable resin composition may be photo-cured by emitting light to the photo-curable resin composition. Accordingly, the first substrate formed with the first diffraction grating layer on one surface may be manufactured. The diffraction grating pattern engraved in the mold may correspond to a pattern of the first diffraction grating layer.

According to the exemplary embodiment of the present invention, a photo-curable resin composition may be applied on the other surface of the first substrate formed with the first diffraction grating layer on one surface, and a surface of the photo-curable resin composition may be imprinted by using a mold having the surface, in which a diffraction pattern is engraved. Then, the photo-curable resin composition may be photo-cured by emitting light to the photo-curable resin composition. The diffraction grating pattern engraved in the mold may correspond to a pattern of the second diffraction grating layer. Accordingly, it is possible to manufacture the first diffraction substrate formed with the first diffraction grating layer on one surface and the second diffraction grating layer on the other surface.

According to the exemplary embodiment of the present invention, the process of photo-curing the photo-curable resin composition may be simultaneously performed with the process of imprinting the mold on the surface of the photo-curable resin composition, or may also be performed after the mold is removed.

According to the exemplary embodiment of the present invention, the first diffraction grating layer may be protected during a process of forming the second diffraction grating layer on the other surface of the first substrate by attaching a release film and the like onto the first diffraction grating layer after the first diffraction grating layer is formed on one surface of the first substrate.

Further, according to the exemplary embodiment of the present invention, the photo-curable resin composition may be applied onto one surface and the other surface of the first substrate and dried at the same time, the surfaces of the photo-curable resin compositions applied onto one surface and the other surface of the first substrate may also be imprinted by using the mold at the same time.

According to the exemplary embodiment of the present invention, the operation of preparing the first diffraction substrate may include applying a photo-curable resin composition on the first substrate and performing imprinting on a surface of the photo-curable resin composition by using a mold having a surface, in which a diffraction pattern is engraved. Then, the first substrate formed with the first diffraction grating layer on one surface may be manufactured by photo-curing the photo-curable resin composition. The photo-curable resin composition may be applied onto the additional substrate, and a surface of the photo-curable resin composition may be imprinted by using a mold having the surface, in which a diffraction pattern is engraved. Then, the additional substrate formed with the second diffraction grating layer on one surface may be manufactured by photo-curing the photo-curable resin composition. Then, the first diffraction substrate may be manufactured by bonding the other surface of the first substrate and the other surface of the additional substrate through an adhesive layer.

According to the exemplary embodiment of the present invention, the operation of preparing the second diffraction substrate may include applying a photo-curable resin composition on the second substrate and performing imprinting on a surface of the photo-curable resin composition by using a mold having a surface, in which a diffraction pattern is engraved. Then, the photo-curable resin composition may be photo-cured by emitting light to the photo-curable resin composition. Accordingly, the second substrate formed with the third diffraction grating layer on one surface may be manufactured. The diffraction grating pattern engraved in the mold may correspond to a pattern of the third diffraction grating layer.

According to the exemplary embodiment of the present invention, the photo-curable resin composition may be applied onto the other surface of the second substrate formed with the third diffraction grating layer on one surface, and a surface of the photo-curable resin composition may be imprinted by using a mold having the surface, in which a reflection preventing pattern is engraved. Then, the photo-curable resin composition may be photo-cured by emitting light to the photo-curable resin composition. The reflection preventing pattern engraved in the mold may correspond to the reflection preventing pattern of the second diffraction grating layer. Accordingly, it is possible to manufacture the first diffraction substrate formed with the third diffraction grating layer on one surface and the stress compensation layer including the reflection preventing pattern on the other surface.

According to the exemplary embodiment of the present invention, the process of photo-curing the photo-curable resin composition may be simultaneously performed with the process of imprinting the mold on the surface of the photo-curable resin composition, or may also be performed after the mold is removed.

According to the exemplary embodiment of the present invention, the third diffraction grating layer may be protected during a process of forming the stress compensation layer on the other surface of the second substrate by attaching a release film and the like onto the third diffraction grating layer after the third diffraction grating layer is formed on one surface of the second substrate.

Further, according to the exemplary embodiment of the present invention, the photo-curable resin composition may be applied onto one surface and the other surface of the second substrate and dried at the same time, the surfaces of the photo-curable resin compositions applied onto one surface and the other surface of the second substrate may also be imprinted by using the mold at the same time.

According to the exemplary embodiment of the present invention, the operation of preparing the second diffraction substrate may include applying a photo-curable resin composition on the second substrate and performing imprinting on a surface of the photo-curable resin composition by using a mold having a surface, in which a diffraction pattern is engraved. Then, the second substrate formed with the third diffraction grating layer on one surface may be manufactured by photo-curing the photo-curable resin composition. A photo-curable resin composition may be applied onto the additional substrate, and a surface of the photo-curable resin composition may be imprinted by using a mold having a surface, in which a reflection preventing pattern is engraved. Then, the additional substrate formed with the stress compensation layer on one surface may be manufactured by photo-curing the photo-curable resin composition. Then, the second diffraction substrate may be manufactured by bonding the other surface of the second substrate and the other surface of the additional substrate by an adhesive layer.

According to the exemplary embodiment of the present invention, the photo-curable resin composition used for forming the first diffraction grating layer to the third diffraction grating layer may include a photo-curable resin containing at least one high refractive component among $TiO_2$, $Al_2O_3$, $Ga_2O_3$, $TeO_2$, $ZrO_2$, $Ta_2O_5$ $Nb_2O_5$, ZnS, HfO, MoO, and CuO. Particularly, the photo-curable resin may be cured by emitting light, and the photo-curable resin may include an acryl-based photo-curable resin, such as a urethane acrylate-based photo-curable resin and an epoxy acrylate-based photo-curable resin, a polyamide-based photo-curable resin, a polyimide-based photo-curable resin, a silicon-based photo-curable resin, an epoxy-based photo-curable resin, and a polyester-based photo-curable resin, but the kind of photo-curable resin is not limited.

According to the exemplary embodiment of the present invention, the photo-curable resin composition including the photo-curable resin including the high refractive component may be applied onto the substrate, and then the diffraction grating layer may be formed on the substrate by photo-curing the photo-curable resin composition. Particularly, a photo-curable resin composition including an acryl-based photo-curable resin containing $ZrO_2$ as a high refractive particle is applied by a spin-coating method, the photo-curable resin composition is dried at a temperature of about 80° C. for about three minutes, and then ultraviolet rays having an intensity of 100 mW/cm² are emitted at a temperature of about 40° C. for 60 seconds or more to photo-cure the photo-curable resin composition.

Further, the photo-curable resin used for forming the stress compensation layer may be cured by emitting light, and the photo-curable resin may include an acryl-based photo-curable resin, such as a urethane acrylate-based photo-curable resin and an epoxy acrylate-based photo-curable resin, a polyamide-based photo-curable resin, a polyimide-based photo-curable resin, a silicon-based photo-curable resin, an epoxy-based photo-curable resin, and a polyester-based photo-curable resin, but the kind of photo-curable resin is not limited. Further, the photo-curable resin used for forming the stress compensation layer may contain at least one high refractive component among $TiO_2$, $Al_2O_3$, $Ga_2O_3$, $TeO_2$, $ZrO_2$, $Ta_2O_5$, $Nb_2O_5$, ZnS, HfO, MoO, and CuO.

According to the exemplary embodiment of the present invention, the light refractive index of each of the first substrate, the second substrate, and the additional substrate may be 1.5 or more and less than 2.0. As long as a substrate generally used in the art has the light refractive index having the foregoing range, the substrate may be used. Particularly, as the substrate, glass including the high refractive component, a resin film including the high refractive component, and the like may be used. The high refractive component may include at least one of $TiO_2$, $Al_2O_3$, $Ga_2O_3$, $TeO_2$, $ZrO_2$, $Ta_2O_5$ $Nb_2O_5$, and ZnS.

According to the exemplary embodiment of the present invention, the mold may be manufactured in consideration of the diffraction pattern included in each of the first diffraction grating layer to the third diffraction grating layer. Further, the mold may be manufactured in consideration of the reflection preventing pattern included in the stress compensation layer. As the mold, a mold usable in the art may be used without a limit, and particularly, a hard mold including a metal or an alloy, such as nickel or a nickel alloy, and an amorphous metal, or a soft mold including polyethylene terephthalate and the like may be used. Further, the mold may be transparent.

According to the exemplary embodiment of the present invention, in order to improve a contact property between the surface of the photo-curable resin composition and the surface of the mold provided with the pattern when the surface of the photo-curable resin composition is imprinted by using the mold, the mold provided with a support may be used. Particularly, a contact property between the surface of the photo-curable resin composition and the surface of the mold provided with the pattern is improved by providing a support to the other surface of the mold, in which the pattern is engraved on one surface, thereby improving imprinting efficiency. The support may include a support layer formed of polyethylene terephthalate (PET) or urethane, and an elastic layer, which is provided on one surface of the support layer and includes polydimethylsiloxane (PDMS), but the kinds of support layer and elastic layer are not limited. Further, the support layer and the elastic layer included in the support may be transparent, and the elastic layer of the support may be provided to be positioned on the other surface of the mold.

FIG. 12 is a diagram schematically illustrating a preparation of a first diffraction substrate by using two substrates according to the exemplary embodiment of the present invention. Particularly, FIG. 12 is a diagram schematically illustrating the case where a photo-curable resin composition 700 is applied onto one surface of a first substrate 610 and one surface of an additional substrate 620 and is dried, the other surface of the first substrate 610 faces the other surface of the additional substrate 620, and then the imprinting is performed by using a mold 810, in which a pattern provided in a first diffraction grating layer is engraved on one surface and a mold 820, in which a pattern provided in a second diffraction grating layer is engraved on one surface. Referring to FIG. 12, a support including PET and PDMS and a support including urethane and PDMS are provided on the other surfaces of the molds 810 and 820, in which the patterns are not formed, respectively, to improve a contact property between the surface of the photo-curable resin compositions and one surfaces of the molds provided with the patterns. Similarly, a second substrate may be prepared by using the same method as the foregoing method.

According to the exemplary embodiment of the present invention, each of the first diffraction grating layer to the third diffraction grating layer and the stress compensation layer may be formed by using a lithography process or a laser etch process. Particularly, a photo-curable resin composition is applied onto one surface of the first substrate and is photo-cured, and then a diffraction pattern is formed on a surface of the cured material formed on one surface of the first substrate by using a lithography process or a laser etch process to form the first diffraction grating layer on one surface of the first substrate. By the same method as the foregoing method, a second diffraction grating layer, the third diffraction grating layer, and a stress compensation layer may be formed.

According to the exemplary embodiment of the present invention, in the operation of attaching the first diffraction substrate and the second diffraction substrate, the diffraction grating layer of the first diffraction substrate may be attached while being spaced apart from the second diffraction substrate by using a spacer. Particularly, one end portion of the first diffraction substrate and one end portion of the second diffraction substrate, and the other end portion of the first diffraction substrate and the other end portion of the second diffraction substrate may be connected through the spacers. As the spacer, a publicly known configuration, which is capable of connecting the first diffraction substrate and the second diffraction substrate, may be used, and a configuration having elasticity may also be used as the spacer.

According to the exemplary embodiment of the present invention, in the state where the first diffraction grating layer or the second diffraction grating layer is spaced apart from the third diffraction grating layer or the stress compensation layer, the first diffraction substrate may be attached to the second diffraction substrate. That is, the first diffraction grating layer or the second diffraction grating layer included in the first diffraction substrate is prevented from being in contact with the third diffraction grating layer or the stress compensation layer included in the second diffraction substrate, so that the first diffraction substrate and the second diffraction substrate may be attached through the spacer.

Another exemplary embodiment of the present invention provides a display unit including the diffraction light guide plate. The display unit may implement a provided image in the form of AR, MR, or VR.

DESCRIPTION OF REFERENCE NUMERALS

10: Substrate layer
11: First substrate layer
12: Second substrate layer
13: Third substrate layer 20: Pattern layer
21: First pattern layer
22: Second pattern layer
23: Third pattern layer
100: First diffraction substrate
200: Second diffraction substrate
310: First diffraction grating layer
320: Second diffraction grating layer
330: Third diffraction grating layer
311, 321, 331: First diffraction pattern
312, 322, 332, 332': Second diffraction pattern
313, 323, 333: Third diffraction pattern
400: Spacer
511, 521, 531: First area
512, 522, 532, 532': Second area
513, 523, 533: Third area
610: First substrate
620: Additional substrate
700: Photo-curable resin composition
810, 820: Mold
900: Stress compensation layer

MODE FOR CARRYING OUT THE INVENTION

Hereinafter, the present invention will be described in detail based on Examples. However, Examples according to the present invention may be modified into other various forms, and it is not construed that the scope of the present invention is limited to Examples described below. Examples of the present specification are provided for more completely explaining the present invention to those skilled in the art.

Example 1

A photo-curable resin composition including a photo-curable resin prepared from a composition including propyleneglycolmonomethyl ether acetate (PGMEA) as a solvent, $ZrO_2$ as high-refractive particles, dipentaerythritol hexaacrylate (DPHA) as a monomer, and Irgacure 184 as a photopolymerization initiator was prepared. Glass having a thickness of 0.8 mm and a light refractive index of about 1.5 with respect to light having a wavelength of 400 nm or more and 700 nm or less was prepared as a first substrate and a second substrate.

The prepared photo-curable resin composition was applied on one surface of the first substrate, and was dried at a temperature of about 80° C. for about three minutes. Then, the imprinting was performed on a surface of the photo-curable resin composition on the first substrate by using a mold, in which a predetermined pattern of a first diffraction grating layer is engraved. During the imprinting process, the first substrate provided with the first diffraction grating layer on one surface was manufactured by photo-curing the photo-curable resin composition by emitting ultraviolet rays having an intensity of about 100 mw/cm² at a temperature of about 40° C. for about 60 seconds. Then, the prepared photo-curable resin composition was applied on the other surface of the first substrate, and was dried at a temperature of about 80° C. for about three minutes. Then, the imprinting was performed on a surface of the photo-curable resin composition on the first substrate by using a mold, in which a predetermined pattern of a second diffraction grating layer is engraved. During the imprinting process, the first substrate provided with the first diffraction grating layer on one surface and the second diffraction grating layer on the other surface was manufactured by photo-curing the photo-curable resin composition by emitting ultraviolet rays having an intensity of about 100 mw/cm² at a temperature of about 40° C. for about 60 seconds.

The prepared photo-curable resin composition was applied on one surface of the second substrate, and was dried at a temperature of about 80° C. for about three minutes. Then, the imprinting was performed on a surface of the photo-curable resin composition on the second substrate by using a mold, in which a predetermined pattern of a third diffraction grating layer is engraved. During the imprinting process, the second substrate provided with the third diffraction grating layer on one surface was manufactured by photo-curing the photo-curable resin composition by emitting ultraviolet rays having an intensity of about 100 mw/cm² at a temperature of about 40° C. for about 60 seconds. Then, the prepared photo-curable resin composition was applied on the other surface of the second substrate, and was dried at a temperature of about 80° C. for about three minutes. Then, the imprinting was performed on a surface of the photo-curable resin composition on the second substrate by using a mold, in which a predetermined reflection preventing pattern is engraved. During the imprinting process, the second substrate provided with the third diffraction grating layer on one surface and the stress compensation layer including the reflection preventing pattern on the other surface was manufactured by photo-curing the photo-curable resin composition by emitting ultraviolet rays having an intensity of about 100 mw/cm² at a temperature of about 40° C. for about 60 seconds.

Then, the other surface of the first diffraction substrate was positioned to face the other surface of the second diffraction substrate, and then, one end portion of the first diffraction substrate and one end portion of the second diffraction substrate, and the other end portion of the first diffraction substrate and the other end portion of the second diffraction substrate were connected through spacers. Accordingly, a diffraction light guide plate including the first diffraction substrate and the second diffraction substrate was manufactured.

Example 2

A diffraction light guide plate was manufactured by the same method as that of Example 1, except that a thiourethane-based film having a thickness of 0.8 mm and a light refractive index of about 1.73 with respect to light having a wavelength of 400 nm or more and 700 nm or less was prepared as a first substrate and a second substrate.

Analysis of Cross-Sections of the First Diffraction Grating Layer and the Second Diffraction Grating Layer The cross-sections of the first diffraction grating layer and the second diffraction grating layer manufactured in Example 1 were analyzed by using an electron microscope (S-1400, Hitachi, Ltd.).

FIG. 13A is a scanning electron microscope (SEM) picture of the first diffraction grating layer according to Example 1 of the present invention, and FIG. 13B is an SEM picture of the second diffraction grating layer according to Example 1 of the present invention. Particularly, (A) of FIG. 13A is a picture obtained by photographing the first diffraction grating layer at 5,000 magnifications, (B) of FIG. 13A is a picture obtained by photographing the first diffraction grating layer at 15,000 magnifications, and (C) of FIG. 13A is a picture obtained by photographing the first diffraction grating layer at 100,000 magnifications. Further, (A) of FIG. 13B is a picture obtained by photographing the second diffraction grating layer at 5,000 magnifications, (B) of FIG. 13B is a picture obtained by photographing the second diffraction grating layer at 15,000 magnifications, and (C) of FIG. 13B is a picture obtained by photographing the second diffraction grating layer at 100,000 magnifications.

Referring to FIGS. 13A and 13B, it can be seen that it is possible to easily manufacture the diffraction light guide plate including the first diffraction substrate provided with the first diffraction grating layer and the second diffraction grating layer through the method according to the exemplary embodiment of the present invention.

Analysis of Form of the Second Diffraction Substrate

The forms of the third diffraction grating layer and the stress compensation layer manufactured in Example 1 were analyzed by using an electron microscope (S-1400, Hitachi, Ltd.).

FIG. 14 is an SEM picture of the third diffraction grating layer according to Example 1 of the present invention. Particularly, (A) of FIG. 14 is a picture obtained by photographing a cross-section of the third diffraction grating layer at 5,000 magnifications, (B) of FIG. 14 is a picture obtained by photographing a plane of the third diffraction grating layer at 15,000 magnifications, and (C) of FIG. 14 is a picture obtained by photographing a plane of the third diffraction grating layer at 100,000 magnifications.

Referring to FIG. 14, it can be seen that it is possible to easily manufacture the second diffraction grating substrate including the third diffraction grating layer through the method according to the exemplary embodiment of the present invention.

FIG. 15 is an SEM picture of the stress compensation layer including the reflection preventing pattern according to Example 1 of the present invention. Referring to FIG. 15, a moth-eye pattern is formed on the stress compensation layer as the reflection preventing pattern. Particularly, (A) of FIG. 15 is a picture obtained by photographing a surface of the stress compensation layer including the moth-eye pattern at 10,000 magnifications, (B) of FIG. 15 is a picture obtained by photographing the surface of the stress compensation layer including the moth-eye pattern at 50,000 magnifications, (C) of FIG. 15 is a picture obtained by photographing a cross-section of the stress compensation layer including the moth-eye pattern at 10,000 magnifications, and (D) of FIG. 15 is a picture obtained by photographing the cross-section of the stress compensation layer including the moth-eye pattern at 50,000 magnifications.

Referring to FIG. 15, it can be seen that it is possible to easily manufacture the second diffraction substrate including the stress compensation layer including the moth-eye pattern as the reflection preventing pattern through the method according to the exemplary embodiment of the present invention.

Analysis of Light Transmittance of the Second Diffraction Substrate

Reference Example 1

A glass substrate having a thickness of 0.8 mm and a light refractive index of about 1.5 with respect to light having a wavelength of 400 nm or more and 700 nm or less was prepared.

Reference Example 2

The same substrate as that of Reference Example 1 was prepared, and the same photo-curable resin composition as that prepared in Example 1 was prepared. Then, the photo-curable resin composition was applied on one surface of the substrate, and was dried at a temperature of about 80° C. for about three minutes. Then, the substrate formed with the resin layer on one surface was manufactured by curing the photo-curable resin composition by emitting ultraviolet rays having an intensity of about 100 mW/cm² at a temperature of about 40° C. for about 60 seconds.

Reference Example 3

The same substrate as that of Reference Example 1 was prepared, and the same photo-curable resin composition as that prepared in Example 1 was prepared. Then, the photo-curable resin composition was applied on one surface of the substrate, and was dried at a temperature of about 80° C. for about three minutes. Then, imprinting was performed on a surface of the photo-curable resin composition applied on one surface of the substrate by using a mold, in which a predetermined reflection preventing pattern is engraved. During the imprinting process, the substrate formed with the resin layer including the reflection preventing pattern was manufactured by curing the photo-curable resin composition by emitting ultraviolet rays having an intensity of about 100 mW/cm² at a temperature of about 40° C. for about 60 seconds.

Reference Example 4

The same substrate as that of Reference Example 1 was prepared, and the same photo-curable resin composition as that prepared in Example 1 was prepared. Then, the photo-curable resin composition was applied on one surface of the substrate, and was dried at a temperature of about 80° C. for about three minutes. Imprinting was performed on a surface of the photo-curable resin composition applied on the substrate by using a mold, in which a predetermined pattern of the third diffraction grating layer is engraved. During the imprinting process, the substrate formed with the third diffraction grating layer on one surface was manufactured by photo-curing the photo-curable resin composition by emitting ultraviolet rays having an intensity of about 100 mw/cm² at a temperature of about 40° C. for about 60 seconds.

Reference Example 5

The same substrate as that of Reference Example 1 was prepared, and the same photo-curable resin composition as that prepared in Example 1 was prepared. Then, the photo-curable resin composition was applied on one surface of the substrate, and was dried at a temperature of about 80° C. for about three minutes. Imprinting was performed on a surface of the photo-curable resin composition applied on the substrate by using a mold, in which a predetermined pattern of the third diffraction grating layer is engraved. During the imprinting process, the photo-curable resin composition was photo-cured by emitting ultraviolet rays having an intensity of about 100 mW/cm² at a temperature of about 40° C. for about 60 seconds. Then, the photo-curable resin composition was applied on the other surface of the substrate, and was dried at a temperature of about 80° C. for about three minutes. Then, the substrate formed with the third diffraction grating layer on one surface and the resin layer on the other surface was manufactured by photo-curing the photo-curable resin composition by emitting ultraviolet rays having an intensity of about 100 mW/cm² at a temperature of about 40° C. for about 60 seconds.

Reference Example 6

A thiourethane-based film having a thickness of 0.8 mm and a light refractive index of about 1.73 with respect to light having a wavelength of 400 nm or more and 700 nm or less was prepared.

Reference Example 7

The same substrate as that of Reference Example 6 was prepared, and the same photo-curable resin composition as that prepared in Example 1 was prepared. Imprinting was performed on a surface of the photo-curable resin composition applied on the substrate by using a mold, in which a predetermined pattern of the third diffraction grating layer is engraved. During the imprinting process, the substrate formed with the third diffraction grating layer on one surface was manufactured by photo-curing the photo-curable resin composition by emitting ultraviolet rays having an intensity of about 100 mw/cm² at a temperature of about 40° C. for about 60 seconds.

FIG. 16 is a graph illustrating a result of a measurement of a light transmittance of the second diffraction substrate prepared in Example 1 of the present invention and the substrates prepared in Reference Examples 1 to 5. Particularly, FIG. 16 represents the result of the measurement of light transmittance obtained by emitting a light source (JIS K7136) having a wavelength of 380 nm or more and 1,200 nm or less to the second diffraction substrate prepared in Example 1 and the substrates prepared in Reference Examples 1 to 5 and using the light transmittance measuring device HM 150.

Referring to FIG. 16, it can be seen that the second diffraction substrate including the third diffraction grating layer and the stress compensation layer prepared in Example 1 of the present invention has more excellent light transmittance than that of the substrates prepared in Reference Examples 1 to 5 with respect to light having a wavelength of about 700 nm or more and 1,200 nm or less.

FIG. 17 is a graph illustrating a result of a measurement of light transmittance of the second diffraction substrate prepared in Example 2 of the present invention and the substrates prepared in Reference Examples 6 and 7. Particularly, FIG. 17 represents the result of the measurement of light transmittance obtained by emitting a light source (JIS K7136) having a wavelength of 380 nm or more and 1,200 nm or less to the second diffraction substrate prepared in Example 2 and the substrates prepared in Reference Examples 6 and 7 and using the light transmittance measuring device HM-150.

Referring to FIG. 17, it can be seen that the second diffraction substrate including the third diffraction grating layer and the stress compensation layer prepared in Example 2 of the present invention has more excellent light transmittance than that of the substrates prepared in Reference Examples 6 and 7 with respect to light having a wavelength of about 700 nm or more and 1,200 nm or less.

Analysis of Bending of the Second Diffraction Substrate

Reference Example 8

A thiourethane-based film having a thickness of 0.8 mm and a light refractive index of about 1.73 with respect to light having a wavelength of 400 nm or more and 700 nm or less was prepared.

Then, the thiourethane-based film was left at a temperature of 80° C. for about three minutes (a drying operation). Then, ultraviolet rays having an intensity of about 100 mW/cm² were emitted at a temperature of 40° C. for about 60 seconds (a UV emission operation).

Reference Example 9

The same substrate as that of Reference Example 8 was prepared, and the same photo-curable resin composition as that prepared in Example 1 was prepared. Then, the photo-curable resin composition was applied on one surface of the substrate (the application operation). Then, the substrate, on which the photo-curable resin composition was applied, was dried at a temperature of 80° C. for about three minutes (a drying operation). Then, imprinting was performed on a surface of the photo-curable resin composition applied on one surface of the substrate by using a mold, in which a predetermined reflection preventing pattern is engraved. During the imprinting process, the substrate formed with a stress compensation layer including a reflection preventing pattern on one surface was manufactured by curing the photo-curable resin composition by emitting ultraviolet rays having an intensity of about 100 mW/cm² at a temperature of about 40° C. for about 60 seconds (an UV emission operation).

During the processes of manufacturing the substrates in Reference Examples 8 and 9, the transformation of the substrate was photographed by using a 3D-coordinate measuring machine (3D-CMM) in the form of a 3D image.

FIG. 18A is a diagram illustrating a 3D image of the substrate according to the process of manufacturing the substrate in Reference Example 8, and FIG. 18B is a diagram illustrating a 3D image of the substrate according to the process of manufacturing the substrate in Reference Example 9. Particularly, FIG. 18A is the 3D images of the form of the substrate prepared in Reference Example 8, the form of the substrate after the drying operation, and the form of the substrate after the UV emission operation. Further, FIG. 18B is the 3D images of the form of the substrate prepared in Reference Example 9, the form of the substrate after the application operation, the form of the substrate after the drying operation, and the form of the substrate after the UV emission operation.

Referring to FIG. 18A, when the drying operation and the UV emission operation under the same condition as that of the process of manufacturing the diffraction substrate according to the exemplary embodiment of the present invention are performed in Reference Example 8, it can be seen that the substrate is transformed. In the meantime, referring to FIG. 18B, in the case of Reference Example 9, it can be seen that even though the drying operation and the UV emission operation are performed, the substrate is suppressed from being transformed by forming the stress compensation layer on one surface of the substrate.

Accordingly, it may be predicted that the second diffraction substrate is suppressed from being transformed during the process of manufacturing the second diffraction substrate by forming the stress compensation layer on the other surface of the second diffraction substrate formed with the third diffraction grating layer on one surface. Further, it may also be predicted that the first diffraction substrate is suppressed from being transformed during the process of manufacturing the first diffraction substrate by forming the second diffraction grating layer on the other surface of the first diffraction substrate formed with the first diffraction grating layer on one surface.

The invention claimed is:

1. A diffraction light guide plate, comprising:
a first diffraction substrate; and
a second diffraction substrate provided on the first diffraction substrate,
wherein the first diffraction substrate includes a first diffraction grating layer in direct contact with one surface of the first diffraction substrate and a second diffraction grating layer in direct contact with an opposite surface of the first diffraction substrate,
wherein the second diffraction substrate includes a third diffraction grating layer in direct contact with one surface of the second diffraction substrate and a stress compensation layer in direct contact with an opposite surface of the second diffraction substrate,
wherein the first diffraction grating layer separates light having a wavelength of 550 nm or more and 700 nm or less,
wherein the second diffraction grating layer separates light having a wavelength of 400 nm or more and 550 nm or less,
wherein the third diffraction grating layer separates light having a wavelength of 450 nm or more and 650 nm or less, and
wherein the stress compensation layer has stress in a same direction as a direction of stress of the third diffraction grating layer.

2. The diffraction light guide plate of claim 1, wherein the stress compensation layer includes a reflection prevention pattern.

3. The diffraction light guide plate of claim 1, wherein a thickness of each of the first diffraction substrate and the second diffraction substrate is 0.1 mm or more and 2 mm or less.

4. The diffraction light guide plate of claim 1, wherein the first diffraction grating layer is spaced apart from the second diffraction substrate.

5. The diffraction light gyuide plate of claim 1, wherein each of the first, second and third diffraction grating layers includes:
a first area, wherein light is incident on the first layer;
a second layer, wherein light is incident on the first area is expanded and moves in the second area; and
a third area, wherein light of the second area is extracted into the third area,
wherein the first area of each of the first, second and third diffraction grating layers are at corresponding positions of each of the first, second and third diffraction grating layers, respectively, and
wherein the third area of each of the first, second and third differaction grating layers are at corresponding positions of each of the first, second and third diffraction grating layers, respectively.

6. The diffraction light guide plate of claim 5, wherein a light refractive index of the third area of each of the first, second and third diffraction grating layers gradually increases from one side of the third area to an opposite side of the third area.

7. The diffraction light guide plate of claim 5, wherein the third area of each of the first, second and third diffraction grating layers includes a diffraction pattern including an inclined pattern structure, wherein a depth of the diffraction pattern gradually increases from one side of the inclined pattern structure to an opposite side of the inclined pattern structure.

8. The diffraction light guide plate of claim 5, wherein the third area of each of the first, second and third diffraction grating layers includes a diffraction pattern including a pattern structure, wherein a duty of the diffraction pattern gradually increases from one side of the pattern structure to an opposite side of the pattern structure.

9. A method of manufacturing the diffraction light guide plate of claim 1, the method comprising:
preparing a first diffraction substrate;
preparing a second diffraction substrate; and
attaching the first diffraction substrate and the second diffraction substrate,
wherein the preparing of the first diffraction substrate includes forming a first diffraction grating layer in direct contact with one surface of the first diffraction substrate and forming a second diffraction grating layer in direct contact with an opposite surface of the first diffraction substrate, and
wherein the preparing of the second diffraction substrate includes forming a third diffraction grating layer in direct contact with one surface of the second diffraction substrate and forming a stress compensation layer in direct contact with an opposite surface of the second diffraction substrate.

10. The method of claim 9, wherein the preparing of the second diffraction substrate further includes forming a reflection prevention pattern on the stress compensation layer.

11. The method of claim 10, wherein each of the first, second and third diffraction grating layers and the stress compensation layer is formed using a photo-curable resin composition and an imprinting mold in an imprinting process.

12. The method of claim 10, wherein each of the first, second and third diffraction grating layers and the stress compensation layer is formed using a lithography process or a laser etch process.

13. The method of claim 9, wherein the attaching of the first diffraction substrate and the second diffraction substrate includes attaching the first diffraction substrate and the second diffraction substrate with a spacer therebetween so that the second diffraction grating layer of the first diffraction substrate is spaced apart from the second diffraction substrate.

* * * * *